United States Patent
Hudson

(10) Patent No.: US 10,445,443 B2
(45) Date of Patent: Oct. 15, 2019

(54) GROUND SUPPORT DESIGN TOOL

(71) Applicant: Freeport-McMoRan Inc., Phoenix, AZ (US)

(72) Inventor: Richard Hudson, Phoenix, AZ (US)

(73) Assignee: Freeport-McMoRan Inc., Phoenix, AZ (US)

( * ) Notice: Subject to any disclaimer, the term of this patent is extended or adjusted under 35 U.S.C. 154(b) by 279 days.

(21) Appl. No.: 15/274,052

(22) Filed: Sep. 23, 2016

(65) Prior Publication Data

US 2017/0091355 A1 Mar. 30, 2017

Related U.S. Application Data

(60) Provisional application No. 62/233,719, filed on Sep. 28, 2015.

(51) Int. Cl.
| | |
|---|---|
| *G06F 17/50* | (2006.01) |
| *E02D 1/02* | (2006.01) |
| *G01V 13/00* | (2006.01) |
| *G01V 99/00* | (2009.01) |
| *G06F 3/0484* | (2013.01) |

(52) U.S. Cl.
CPC ......... *G06F 17/5009* (2013.01); *E02D 1/025* (2013.01); *G01V 13/00* (2013.01); *G01V 99/005* (2013.01); *G06F 17/5004* (2013.01); *G06F 3/04847* (2013.01)

(58) Field of Classification Search
CPC ...... E21D 11/00; E21D 11/155; B21F 27/128; E21F 17/00; E21C 35/20; G01N 1/26
See application file for complete search history.

(56) References Cited

U.S. PATENT DOCUMENTS

| | | | |
|---|---|---|---|
| 4,095,433 A | 6/1978 | Yamamoto et al. | |
| 4,505,622 A * | 3/1985 | Asszonyi | B21F 27/128 405/146 |
| 6,757,642 B1 * | 6/2004 | Boudreau | E21F 17/00 703/1 |
| 8,224,631 B2 * | 7/2012 | Stankus | E21D 11/00 405/259.1 |
| 2004/0045741 A1 | 3/2004 | Tessari et al. | |
| 2004/0207247 A1 | 10/2004 | Jackson et al. | |
| 2011/0006774 A1 | 1/2011 | Baiden | |
| 2012/0207549 A1 | 8/2012 | Wegener | |

(Continued)

FOREIGN PATENT DOCUMENTS

WO 2010039240 A1 4/2010

OTHER PUBLICATIONS

British Standard, "Eurocode 7—Geotechnical Design", 2007.*

(Continued)

*Primary Examiner* — Kandasamy Thangavelu
(74) *Attorney, Agent, or Firm* — Fennemore Craig, P.C.

(57) ABSTRACT

A method of designing an underground excavation may involve the steps of: Developing a plurality of input parameters for the underground excavation; performing a first design iteration to determine an initial ground support system design; evaluating a kinematic stability of the initial ground support system design; determining whether the kinematic stability meets a predetermined factor of safety; and reiterating the initial ground support system design until the kinematic stability meets the predetermined factor of safety.

29 Claims, 29 Drawing Sheets

(56) References Cited

U.S. PATENT DOCUMENTS

| | | | |
|---|---|---|---|
| 2012/0253756 A1 | 10/2012 | Favier | |
| 2013/0051931 A1* | 2/2013 | Denver | E21D 11/155 405/288 |
| 2013/0110400 A1* | 5/2013 | Moshe | G01N 1/26 702/3 |
| 2013/0231910 A1 | 9/2013 | Kumar et al. | |
| 2014/0339880 A1* | 11/2014 | Mac Intyre | E21C 35/20 299/18 |

OTHER PUBLICATIONS

Hadjigeorgiou et al., "Design of ventilation raises using fracture systems" ARMA/USEMS 05-892, 2005.*

Schubert et al., "The Guidelines for geomechanical design of underground structures with conventional excavation", 2003.*

Schubert, W., "Basics and application o Austrian guideline for the geomechanical design of underground structures", Eurorock, 2004.*

Marence, M., "Geotechnical design of underground structures", 2003.*

Longford et al., "reliable support design for excavations in brittle rock using a global response surface method", 2015.*

PCT International Search Report and Written Opinion, dated Feb. 6, 2017, corresponding to PCT Application No. PCT/US2016/053679, 11 pages.

Barton, Some New Q-Value Correlations to Assist in Site Characterisation and Tunnel Design, International Journal of Rock Mechanics and Mining Sciences 39, Feb. 5, 2002, 185-216, Pergamon, Hovik, Norway.

Bieniawski, Engineering Rock Mass Classification, A Complete Manual for Engineers and Geologists in Mining, Civil and Petroleum Engineering, 1989 A Wiley-Interscience Publication.

Bieniawski, Rock Mass Classifications in Rock Engineering, Proceedings of the Symposium on Exploration of Rock Engineering, Nov. 1976, Johannesburg.

Degagne, Corkum, Lorig, Estimation of Tunnel Squeezing in Anisotropic Stress Fields Using a FLAC-Based Neural Network, Continuum and Distinct Element Numerical Modeling in Geomechanics, Sainsbury, Hart, Detournay and Nelson (eds) 2011 Paper 03-06, Itasca International Inc. Minneapolis.

Diederichs, Martin, Measurement of Spalling Parameters from Laboratory Testing, Rock Mechanics in Civil Environmental Engineering, Zhao, Labiouse, Dudt & Mathier (eds) Taylor & Francis Group, London 2010.

Diederichs, Carter, Martin, Practical Rock Spall Prediction in Tunnels, Queen's University, Kingston Canada, Golder Associates, Mississauga, Ontario, Canada, University of Alberta, Edmonton.

Grimstad, Barton, Updating of the Q-System for NMT, Norwegian Geotechnical Institute, Norway.

Hoek, Carter, Diederichs, Quantification of the Geological Strength Index Chart, American Rock Mechanic's Association (ARMA) 2013, 13-672, Geomechanics Symposium in San Francisco.

Hoek, Marinos, Predicting Tunnel Squeezing Problems in Weak Heterogeneous Rock Masses, 2000 Tunnels and Tunnelling International, Part 1—Nov. 2000, Part 2—Dec. 2000.

Hoek, Carranza-Torres, Corkum, Hoek-Brown Failure Criterion, 2002 Edition, Proc NARMS-TAC Conference 2002, 1, 267-273, Toronto.

Hoek, Brown, Underground Excavation in Rock, Institute of Mining and Metallurgy, Revised first edition, CRC Press Taylor & Francis Group, Boca Raton, London, NY.

Kaiser, McCreath, Tannant, Candian Rockburst Support Handbook, Prepared for Sponsors of the Canadian Rockburst Research Program 1990-1995, Jan. 1996, Geomechanics Research Centre.

Marinos, Hoek, GSI: A Geologically Friendly Tool for Rock Mass Strength Estimation.

Using the Q-System Rock Mass Classification and Support Design, May 2015, NGI, Oslo Norway.

Palmstrom, Characterizing Rock Masses by the RMi for Use in Practical Rock Engineering, Tunnelling and Underground Space Technology, 1996, vol. 11, No. 2, pp. 175-188, Elsevier Science LTD, Great Britain.

Peck, Determining the Stress Reduction Factor in Highly Stressed Jointed Rock, Jun. 2000, Australian Geomechanics.

Priest, Hudson, Estimation of Discontinuity Spacing and Trace Length Using Scanline Surveys, Int. J. Rock Mech. Min. Sci. & Geomech. Abstr. 1981, vol. 18, pp. 183 to 197, Great Britain.

Hoek, PUtting Nos. To Geology—An Engineer's Viewpoint, Quarterly Journal of Engineering Geology, vol. 32, No. 1, 1999, pp. 1-19.

Unwedge 3.0 Underground Wedge Stability Software, 2010 Rocscience Inc.

Australia Examination Report No. 1 for Standard Patent Application, dated Feb. 7, 2019, Australian Patent Application No. 2016332449, corresponding to PCT/2016/053679, 3 pages.

State Intellectual Property Office of the P.R.C. First Office Action, dated Feb. 2, 2019, Chinese Application No. 2016800561747, corresponding to PCT/2016/053679, 7 pages.

European Supplementary Partial Search Report, European Patent Application No. 16852360.3, corresponding to PCT/US2016/053679, dated May 15, 2019, 20 pages.

Australian Notice of Acceptance and Bibliographic Attachment, dated May 8, 2019, Australian Patent Application No. 2016332449, corresponding to PCT/US2016/053679, 3 pages.

* cited by examiner

66

70

| DATE |
| DRAWING NUMBER |
| AREA ASSESSED |
| GROUND SUPPORT ZONE # |
| DESIGNER |

| INPUT FOLLOWING FIELDS | | UNITS |
|---|---|---|
| EXCAVATION DETAILS | VALUE | |
| EXCAVATION USE DESIGNATION | ZONE2: MEDIUM OCCUPANCY/EXPOSURE | |
| SPAN ($D_W$) | 4.4 | METERS |
| HEIGHT ($D_H$) | 4.4 | METERS |
| EQUIVALENT RADIUS (m) - ROOF | 3.11 | METERS |
| EQUIVALENT RADIUS (m) - WALL | 3.11 | METERS |
| SHAPE | 4: HORSESHOE | |
| TREND | 56 | DEGREES |
| PLUNGE | 0 | DEGREES |

STRESS MODEL QUERY COORDINATES

| | | |
|---|---|---|
| HORIZONTAL GRID SPACING | 25 | m |
| VERTICAL GRID SPACING | 25 | m |

| | MINE COORDINATES | | |
|---|---|---|---|
| | EASTING | NORTHING | ELEV. |
| CENTER | 734700 | 9550700 | 2785 |
| MIN | 734675 | 9550675 | 2760 |
| MAX | 734725 | 9550725 | 2810 |

EXCAVATION STRESS QUERY

| | | |
|---|---|---|
| EXCAVATION STRIKE (AZIMUTH) | 215 | DEGREES |
| EXCAVATION PLUNGE | 0 | DEGREES |
| ITERATIONS | 10 | |
| STAGE | 9 | |
| LOCATION | 16 | |

EXCAVATION STRESS COMPILER INPUTS

| | | |
|---|---|---|
| MINIMUM PERCENTILE | 10 | % |
| MAXIMUM PERCENTILE | 90 | % |

RUN STRESS COMPILER

DESIGN STRESS STATE DEFINITION

| IN-PLANE VERTICAL STRESS ($\sigma_V$) | 50.0 | MPa |
| IN-PLANE HORIZONTAL STRESS ($\sigma_H$) | 30.0 | MPa |
| MEAN THETA (ANGLE SIGIP) | 0.0 | DEGREES |

80

PRINCIPLE STRESS SOLUTION

|  | STRESSES (MPa) | TREND (AZIMUTH) | PLUNGE (DEGREES) |
|---|---|---|---|
| SIGMA 3 | -12.3 | 56 | 9 |
| SIGMA 2 | -27.3 | 154 | 40 |
| SIGMA 1 | -65.3 | 316 | 48 |

PRINCIPLE STRESS ORIENTATION VECTOR PLOT

82

| INPUT FOLLOWING FIELDS | |
|---|---|
| ROCK MASS RATING VALUES | CALCULATED VALUE |
| Q' | 37.50 |
| Q | 1.65 |
| Q WALL | 4.13 |
| GEOLOGIC STRENGTH INDEX, GSI | 40.00 |
| ROCK MASS RATING, $RMR_{89}$ | 71.00 |
| GROUND TYPE CATEGORY | 4 |
| ROCK MASS CHARACTERISTICS | |
| ROCK DENSITY (P) | 2900 kg/m3 |
| ROCK QUALITY DESIGNATION (RQD) | 75 NA |
| ESTIMATED RQD FROM FF | 77 |
| NUMBER OF JOINT SETS ($J_n$) | 1+RANDOM NA |
| JOINT ROUGHNESS ($J_r$) | ROUGH-UNDULATING NA |
| JOINT ALTERATION ($J_a$) | SLIGHTLY ALTERED WALLS |
| JOINT PERSISTENCE ($J_p$) | 3-10 m METERS |
| FRACTURE FREQUENCY (ff) | 9 ff/m |
| GROUND WATER ($J_w$) | DRY OR MINOR INFLOW NA |
| STRENGTH REDUCTION FACTOR (SRF) | 15 NA |
| COMPETENT ROCK SRF GUIDANCE (PECK, 2000) | NA |
| EXCAVATION SUPPORT RATIO (ESR) | 1.3 |
| UNIAXIAL COMPRESSIVE STRENGTH ($\sigma_c$) | 60 MPa |
| JOINT SPACING ($J_s$) | 200-600mm |
| ESTIMATED JOINT SPACING | 0.11 METERS |
| ESTIMATED BLOCK SIDE LENGTH | 0.23 METERS |
| ESTIMATED BLOCK SIZE | 0.012 m$^3$ |
| MISCELLANEOUS CALCS | |
| EQUIVALENT DIMENSION, $D_e$ (SPAN/ESR) (ROOF) | 4.2 |
| EQUIVALENT DIMENSION, $D_e$ (SPAN/ESR) (WALL) | 4.2 |
| GROUND TYPE CATEGORY ESTIMATE | 4 |

FIG.6b

| EXCAVATION DIMENSIONS | VALUE | UNITS |
|---|---|---|
| DRIFT SPAN ($D_w$) | 5.5 | METERS |
| DRIFT HEIGHT ($D_H$) | 5 | METERS |
| TUNNEL ARCH RADIUS | 0.50 | METERS |
| GROUND SUPPORT DESIGN | | |
| SURFACE SUPPORT | | |
| LAYER 1 | SHOTCRETE (MESH REINFORCED) | --- |
| LAYER 2 | NONE | --- |
| LAYER 3 | NONE | --- |
| BOLT DESIGN 1 | | |
| BOLT TYPE | RESIN BAR (20) | --- |
| DISTANCE TO FIRST BOLT | 0.3 | METERS |
| NUMBER OF BOLTS | 13.00 | |
| RING SPACING | 1.21 | METERS |
| ROCKBOLT SPACING | 1.21 | METERS |
| DESIGN BOLT LENGTH GUIDANCE, $L_b$ | 2.6 | METERS |
| BOLT LENGTH | 3 | METERS |
| EXCAVATION PERIMETER | 14.47 | METERS |
| BOLT DESIGN 2 | | |
| BOLT TYPE | CABLE BOLT (15.2) | --- |
| BOLT INSTALLATION LOCATIONS (BACK ONLY, RIB ONLY, BOTH) | BOTH BACK AND RIB | |
| DISTANCE TO FIRST BOLT | 2.2 | METERS |
| NUMBER OF BOLTS | 7.00 | |
| RING SPACING | 1.80 | METERS |
| ROCKBOLT SPACING | 1.85 | METERS |
| BOLT LENGTH | 8 | METERS |
| RING SPACING OFFSET | 0.3 | METERS |
| EXCAVATION PERIMETER | 11.07 | METERS |
| GROUND SUPPORT CAPACITY CHECKS | | |
| GENERAL | | |
| AVAILABLE SUPPORT PRESSURE (NO SHOTCRETE) | 0.215 | MPa |
| AVAILABLE SUPPORT PRESSURE (SCALED) | 0.215 | MPa |
| DISPLACEMENT | | |
| AVAILABLE DISPLACEMENT CAPACITY | 100 | mm |
| REQUIRED DISPLACEMENT ROOF/BACK | 55 | mm |
| REQUIRED DISPLACEMENT RIB | 50 | mm |
| STATIC CAPACITY | | |
| AVAILABLE ROOF/BACK WEDGE CAPACITY (SCALED) | 21.89 | TONNES/$m_2$ |
| REQUIRED ROOF/BACK WEDGE SUPPORT CAPACITY | 1.774 | TONNES/$m_2$ |
| AVAILABLE ROOF/BACK DEPTH OF FAILURE CAPACITY (SCALED) | 21.87 | TONNES/$m_2$ |
| REQUIRED ROOF/BACK DEPTH OF FAILURE CAPACITY | 0.00 | TONNES/$m_2$ |
| AVAILABLE RIB DEPTH OF FAILURE CAPACITY (SCALED) | 21.87 | TONNES/$m_2$ |
| REQUIRED RIB DEPTH OF FAILURE CAPACITY | 0.00 | TONNES/$m_2$ |
| DYNAMIC CAPACITY | | |
| AVAILABLE ENERGY CAPACITY ROOF/BACK (SCALED) | 12.26 | kJ |
| REQUIRED ENERGY CAPACITY ROOF/BACK | 0.00 | kJ |
| AVAILABLE ENERGY CAPACITY RIB (SCALED) | 12.26 | kJ |
| REQUIRED ENERGY CAPACITY RIB | 0.0 | kJ |

INPUT DATA
SPALLING INITIATION THRESHOLD       0.45
IN-PLANE STRESS (VERTICAL) ($\sigma_v$)       10.0 MPa
IN-PLANE STRESS (HORIZONTAL) ($\sigma_h$)     10.0 MPa
UNIAXIAL COMPRESSIVE STRENGTH ($\sigma_{ci}$)  50 MPa
RATIO $\sigma_1/\sigma_{ci}$       0.2
GROUND TYPE CATEGORY ESTIMATE       2
HOEK-BROWN ($m_i$)       25 NA
HOEK-BROWN DISTURBANCE FACTOR (D)    0

EMPIRICAL INDUCED STRESS ESTIMATION
$K_0$(RATIO - HORIZONTAL/VERTICAL STRESS)    1.0
KIRSCH SOLUTION - WALL ($\sigma_{MAX-WALL}$)     20.0 MPa
KIRSH SOLUTION - ROOF/FLOOR ($\sigma_{MAX-ROOF}$)  20.0 MPa
RATIO $\sigma_{MAX}/\sigma_{ci}$ - WALL       0.400
RATIO $\sigma_{MAX}/\sigma_{ci}$ - ROOF/FLOOR    0.400
TANGENTIAL STRESS WALL ($\sigma_{\theta w}$)     13.0 MPa
TANGENTIAL STRESS ROOF ($\sigma_{\theta r}$)     22.0 MPa

EMPIRICAL ROCK MASS STRENGTH ESTIMATION
GEOLOGICAL STRENGTH INDEX (GSI)       35
HOEK BROWN ($m_b$)       2.45 NA
HOEK BROWN (S)       0.001 NA
HOEK BROWN (A)       0.52 NA
ROCKMASS STRENGTH ($\sigma_{cm}$)       9.9 MPa

MASSIVE ROCK (110)

| | | |
|---|---|---|
| SPALLING DEPTH WALL/RIB - (RATIO $\sigma_{MAX}/\sigma_{ci}$) | 0.400 | |
| SPALLING DEPTH OF FAILURE (CRBHB) | 0.00 | METERS |
| SPALLING DEPTH OF FAILURE (DIEDERICHS & MARTIN 2010) | 0.00 | METERS |
| BULKING DISPLACEMENT (5% BULKING) | 0.00 | METERS |
| SPALLING DEPTH ROOF/BACK - (RATIO $\sigma_{MAX}/\sigma_{ci}$) | 0.400 | |
| SPALLING DEPTH OF FAILURE (CRBHB) | 0.00 | METERS |
| SPALLING DEPTH OF FAILURE (DIEDERICHS & MARTIN 2010) | 0.00 | METERS |
| BULKING DISPLACEMENT (5% BULKING) | 0.00 | METERS |

DAMAGE LEVELS MASSIVE ROCK (ASSUMING 0.4 SPALLING THRESHOLD)

| $\sigma_{MAX}/\sigma_{ci}$ | DESCRIPTION OF FRACTURING |
|---|---|
| <0.35 | NO OR LITTLE DAMAGE |
| 0.35 TO 0.45 | MINOR |
| 0.45 TO 0.55 | MODERATE |
| 0.55 TO 0.7 | MODERATE TO MAJOR* |
| >0.7 | MAJOR* |

*POTENTIAL FOR STRAIN BURST

HEAVILY JOINTED ROCK OR SOIL (112)

| | | |
|---|---|---|
| STATIC DEPTH OF FAILURE WALL/RIB | 0.86 | METERS |
| DEPTH OF FAILURE STATIC (FS) | 0.997 | % STRAIN |
| TUNNEL SQUEEZE CHART (% CLOSURE STRAIN) | | METERS |
| TUNNEL SQUEEZE CHART (CLOSURE) | 0.050 | |
| STATIC DEPTH OF FAILURE ROOF/BACK | 0.95 | METERS |
| DEPTH OF FAILURE STATIC (FS) | 0.997 | % STRAIN |
| TUNNEL SQUEEZE CHART (% CLOSURE STRAIN) | | METERS |
| TUNNEL SQUEEZE CHART (CLOSURE) | 0.055 | |

DAMAGE LEVELS HEAVILY JOINTED ROCK

| %STRAIN | DESCRIPTION OF DAMAGE |
|---|---|
| <1% | NO OR LITTLE DAMAGE |
| 1-2.5% | MINOR DAMAGE |
| 2.5-5% | SEVERE SQUEEZING |
| 5-10% | VERY SEVERE SQUEEZING |
| >10% | EXTREME SQUEEZING |

FIG.10a

| BURSTING SUPPORT ASSESSMENT (ASSUMED PROPER ELEMENT TIE IN) | | |
|---|---|---|
| ANTICIPATED DAMAGE MECHANISM | BULKING WITH EJECTION | UNITS |
| GRAVITY (g) | 9.81 | m/s$^2$ |
| SUPPORT DISPLACEMENT CAPACITY ($d_s$) | 0.15 | m |
| SUPPORT LOAD CAPACITY | 0.121 | MPa |
| FAILURE MODE ASSESSMENT | | |
| BULKING ASSESSMENT | | |
| BULKING FACTOR | 5% | |
| BULKING DISPLACEMENT ROOF | 0.00 | m |
| BULKING DISPLACEMENT RIB | 0.13 | |
| BULKING DISPLACEMENT FLOOR | 0.00 | |
| EJECTION ASSESSMENT (BULKING RELATED) | | |
| EJECTION MASS (ROOF/FLOOR) | 0.00 | kg/m$^2$ |
| EJECTION WEIGHT (ROOF/FLOOR) | 0.00 | kN/m$^2$ |
| EJECTION MASS (RIB) | 7445.11 | kg/m$^2$ |
| EJECTION WEIGHT (RIB) | 73.04 | kN/m$^2$ |
| VELOCITY FACTOR (n) | 1 | UNITLESS |
| C* | 0.25 | |
| EJECTION VELOCITY ($V_e$) | 2.500 | m/s |
| EJECTION ENERGY (ROOF) | 0.001 | kJ |
| EJECTION ENERGY (RIB) | 23.266 | kJ |
| EJECTION ENERGY (FLOOR) | 0.001 | kJ |
| SUPPORT CAPACITY ROOF (SCALED) | 13.197 | kJ |
| SUPPORT CAPACITY RIB (SCALED) | 11.000 | kJ |
| SUPPORT CAPACITY FLOOR (ENTER VALUE) | 0.000 | kJ |
| ANTICIPATED ROOF SUPPORT CONDITION FOLLOWING EVENT | SUPPORT WILL EXPERIENCE LITTLE OR NO DAMAGE | |
| ANTICIPATED RIB SUPPORT CONDITION FOLLOWING EVENT | SUPPORT WILL NOT SURVIVE A DYNAMIC EVENT OF THE MAGNITUDE | |
| ANTICIPATED FLOOR SUPPORT CONDITION FOLLOWING EVENT | NO SUPPORT SPECIFIED | |

FIG. 10b

TABLE 2.1 ROCKBURST DAMAGE MECHANISMS AND NATURE OF THE ANTICIPATED DAMAGE

| DAMAGE MECHANISM | DAMAGE SEVERITY | CAUSE OF ROCKBURST DAMAGE | THICKNESS [m] | WEIGHT [kN/m²] | CLOSURE* [mm] | $V_e$ [m/s] | ENERGY [kJ/m²] |
|---|---|---|---|---|---|---|---|
| BULKING WITHOUT EJECTION | MINOR | HIGHLY STRESSED ROCK WITH LITTLE EXCESS STORED STRAIN ENERGY | <0.25 | <7 | 15 | <1.5 | NOT CRITICAL |
|  | MODERATE |  | <0.75 | <20 | 30 | <1.5 | NOT CRITICAL |
|  | MAJOR |  | <1.5 | <50 | 60 | <1.5 | NOT CRITICAL |
| BULKING CAUSING EJECTION | MINOR | HIGHLY STRESSED ROCK WITH SIGNIFICANT EXCESS STRAIN ENERGY | <0.25 | <7 | 50 | 1.5 TO 3 | NOT CRITICAL |
|  | MODERATE |  | <0.75 | <20 | 150 | 1.5 TO 3 | 2 TO 10 |
|  | MAJOR |  | <1.5 | <50 | 300 | 1.5 TO 3 | 5 TO 25 |
| EJECTION BY REMOTE SEISMIC EVENT | MINOR | SEISMIC ENERGY TRANSFER TO JOINTED OR BROKEN ROCK | <0.25 | <7 | <150 | >3 | 3 TO 10 |
|  | MODERATE |  | <0.75 | <20 | <300 | >3 | 10 TO 20 |
|  | MAJOR |  | <1.5 | <50 | >300 | >3 | 20 TO 50 |
| ROCKFALL | MINOR | INADEQUATE STRENGTH, FORCES INCREASED BY SEISMIC ACCELERATION | <0.25 | <7g/(a+g) | NA | NA | NA |
|  | MODERATE |  | <0.75 | <20g/(a+g) | NA | NA | NA |
|  | MAJOR |  | <1.5 | <50g/(a+g) | NA | NA | NA |

$V_e$ IS THE VELOCITY OF DISPLACED OR EJECTED ROCK; a AND g ARE SEISMIC AND GRAVITATIONAL ACCELERATIONS
* CLOSURE EXPECTED WITH AN EFFECTIVE SUPPORT SYSTEM

FIG. 10c

GROUND SUPPORT DESIGN TOOL

CROSS-REFERENCE TO RELATED APPLICATION

This application claims the benefit of U.S. Provisional Patent Application No. 62/233,719, filed on Sep. 28, 2015, which is hereby incorporated herein by reference for all that it discloses.

TECHNICAL FIELD

The present invention relates to the design of underground excavations in general and more particularly to systems and methods of designing ground support systems for underground excavations.

BACKGROUND

Many different methods of designing ground support systems for underground excavations are known and have been used for decades to meet various performance and safety criteria. However, the design methods are typically iterative and require a significant amount of time and effort to select from among the numerous options available for determining support requirements under various conditions.

SUMMARY OF THE INVENTION

One embodiment of a design tool for allowing a user to develop on a computer a design for an underground excavation may include an excavation details tool. The excavation details tool receives information relating to the underground excavation to be developed. A stress estimator tool operatively associated with the excavation details tool receives information relating to stress calculation parameters. The stress estimator tool calculates ground stresses in a vicinity of the underground excavation based on the information relating to stress parameters and the underground excavation to be developed. A rock mass characteristics tool receives information related to geotechnical characteristics of rock mass adjacent the underground excavation. The rock mass characteristics tool also estimates a ground type category based on the information relating to the geotechnical characteristics. A ground support system schematic tool operatively associated with the excavation details tool and the ground support system schematic tool generates at least one schematic representation of the underground excavation to be developed. A wedge assessment tool operatively associated with the excavation details tool, the stress estimator tool, the rock mass characteristics tool, and the ground support system schematic tool estimates support requirements for the underground excavation to be developed and produces information relating to a kinematic stability of the underground excavation to be developed.

Also disclosed is a method of designing an underground excavation that involves the steps of: Developing a plurality of input parameters for the underground excavation; performing a first design iteration to determine an initial ground support system design; evaluating a kinematic and/or dynamic stability of the initial ground support system design; determining whether the kinematic and/or dynamic stability meets a predetermined factor of safety; and reiterating the initial ground support system design until the predetermined factor of safety is achieved.

A ground support design system may include a display system, an input system, and a computer system operatively associated with the display and input systems. The computer system further includes an excavation details tool that generates on the display system a plurality of input fields to allow the user to use the input system to input information relating to an underground excavation to be developed. A stress estimator tool operatively associated with the excavation details tool generates on the display system a plurality of input fields to allow the user to use the input system to input information relating to stress calculation parameters. The stress estimator tool calculates ground stresses in a vicinity of the underground excavation based on the input information relating to stress calculation parameters and the underground excavation to be developed. A rock mass characteristics tool generates on the display system a plurality of input fields to allow the user to use the input system to input information relating to geotechnical characteristics of rock mass adjacent the underground excavation. The rock mass characteristics tool estimates a ground type category based on the input information relating to the geotechnical characteristics. A ground support system schematic tool operatively associated with the excavation details tool generates on the display system at least one schematic representation of the underground excavation to be developed. A wedge assessment tool operatively associated with the excavation details tool, the stress estimator tool, the rock mass characteristics tool, and the ground support system schematic tool estimates support requirements for the underground excavation to be developed. The wedge assessment tool produces information relating to a kinematic stability of the underground excavation to be developed.

BRIEF DESCRIPTION OF THE DRAWINGS

Illustrative and presently preferred exemplary embodiments of the invention are shown in the drawings in which:

FIG. 4 is a pictorial representation of the excavation detail window generated by the excavation details module;

FIG. 5(b) is an enlarged view of the stress model query coordinate area of the stress estimator window illustrated FIG. 5(a);

FIG. 5(c) is an enlarged view of the excavation stress query area of the stress estimator window illustrated FIG. 5(a);

FIG. 5(d) is an enlarged view of the excavation stress compiler inputs area of the stress estimator window illustrated FIG. 5(a);

FIG. 6(b) is an enlarged view of the data input area of the rock mass characteristics window illustrated in FIG. 6(a);

FIG. 8(b) is an enlarged view of the data input and capacity check area of the design schematic window illustrated in FIG. 8(a);

FIG. 9(b) is an enlarged view of the data input area of the depth of failure window illustrated in FIG. 9(a);

FIG. 9(c) is an enlarged view of the massive rock assessment and heavily jointed rock areas of the depth of failure window illustrated in FIG. 9(a);

FIG. 10(a) is a pictorial representation of the bursting support design window generated by the bursting support design module;

FIG. 10(b) is an enlarged view of the data input area of the bursting support design window illustrated in FIG. 10(a);

FIG. 10(c) is an enlarged view of the reference table of the bursting support design window illustrated in FIG. 10(a);

DETAILED DESCRIPTION OF THE PREFERRED EMBODIMENTS

Figure 1:
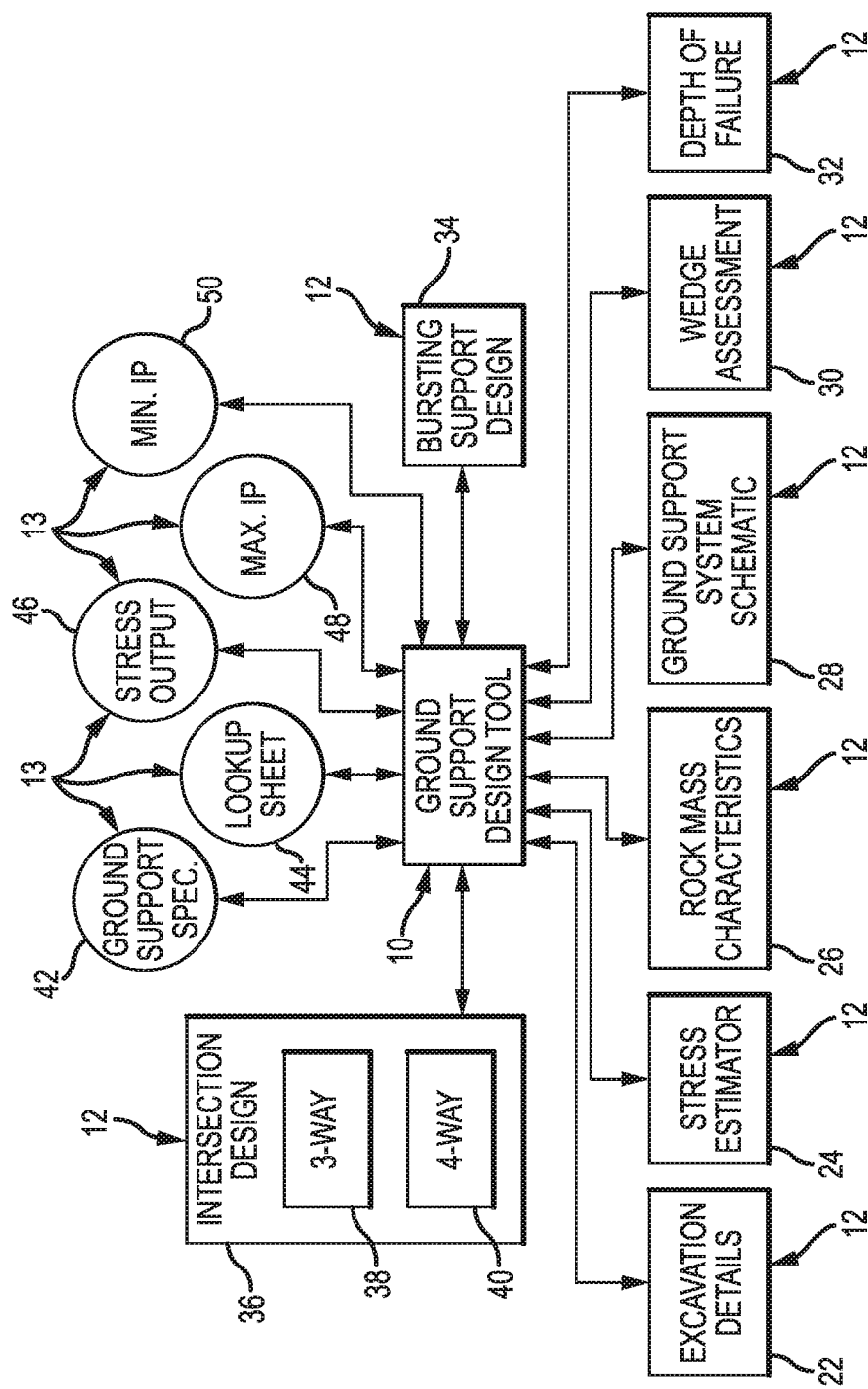
FIG. 1 is a schematic representation of a ground support design tool according to one embodiment of the invention.
Figure 2:
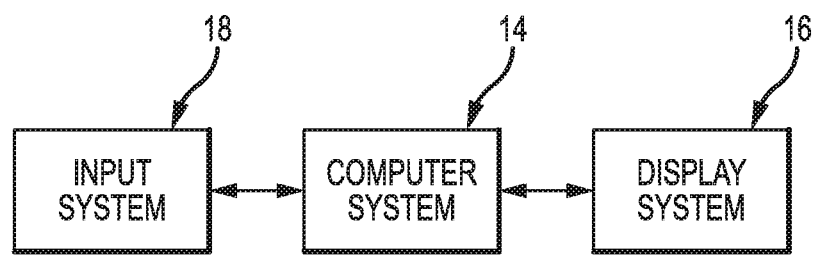
FIG. 2 is a schematic representation of a computer system that may be used to implement the ground support design tool illustrated in FIG. 1.

One embodiment of a ground support design tool or system 10 is illustrated in FIGS. 1 and 2 and may comprise a number of tools or modules 12 that may be utilized to develop ground support designs for underground excavations. The ground support design tool 10 may be implemented on a computer system 14 having at least one display system 16 and at least one user input system 18. When so implemented, the ground support design tool 10 may comprise an integrated system in which the various tools or modules 12 may be displayed on the display system 16 as one or more 'tabs' (not shown), thereby allowing a user to use input system 18 to readily access and/or toggle between the various tools or modules 12 during the design process. User input system 18 also allows the user to input various data and design criteria into computer system 14. Thereafter, such information, data, and design criteria may be used by the ground support design tool 10 to assist the user in developing suitable ground support designs for underground excavations. In addition, various design details, performance and safety parameters, and design iterations may be presented and displayed on display system 16 during the design process, as will be described in much greater detail herein.

Briefly, the tools or modules 12 of ground support design system 10 may comprise an excavation module 22, a stress estimator module 24, a rock mass characteristics module 26, a ground support system schematic module 28, and a wedge assessment module 30. In addition, the ground support design tool 10 may also be provided with a number of additional modules or tools that may be utilized depending on a variety of factors. For example, in one embodiment, such additional modules or tools may include a depth of failure module 32, a bursting support design module 34, an intersection and an intersection design module 36. Intersection design module 36 may comprise design tools or modules 38 and 40 for both 3-way and 4-way intersections.

The ground support development tool 10 may also be provided with a number of supplemental tools or modules 13 to provide additional functionality. In the particular embodiment shown and described herein, the supplemental tools or modules 13 may comprise a ground support specifications module 42, a lookup sheet module 44, a stress estimate output module 46, a max IP module 48, and a min IP module 50.

Figure 3A:
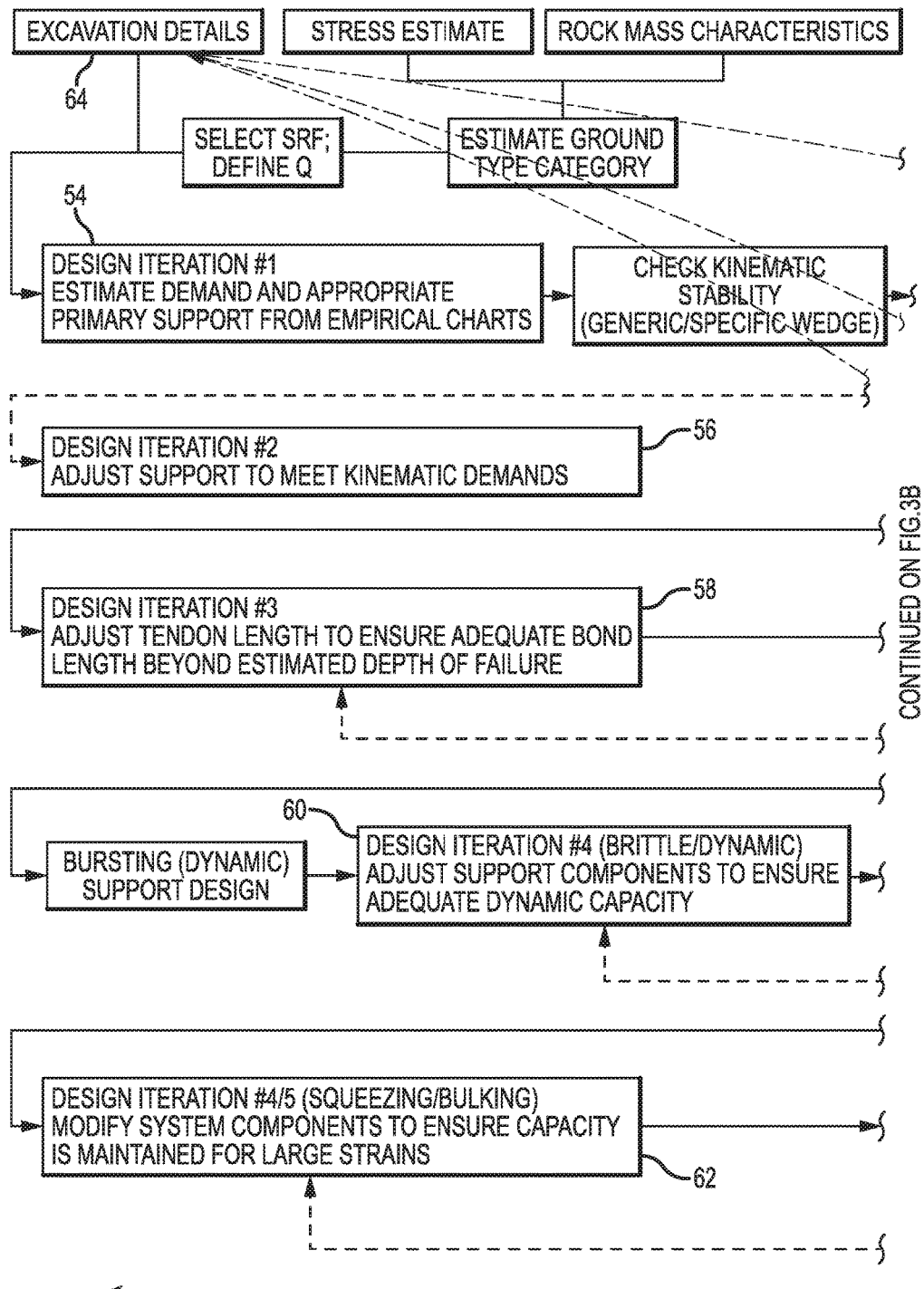
FIGS. 3(a,b) are a flow chart representation of one embodiment of a method for developing a design for an underground excavation.
Figure 3B:
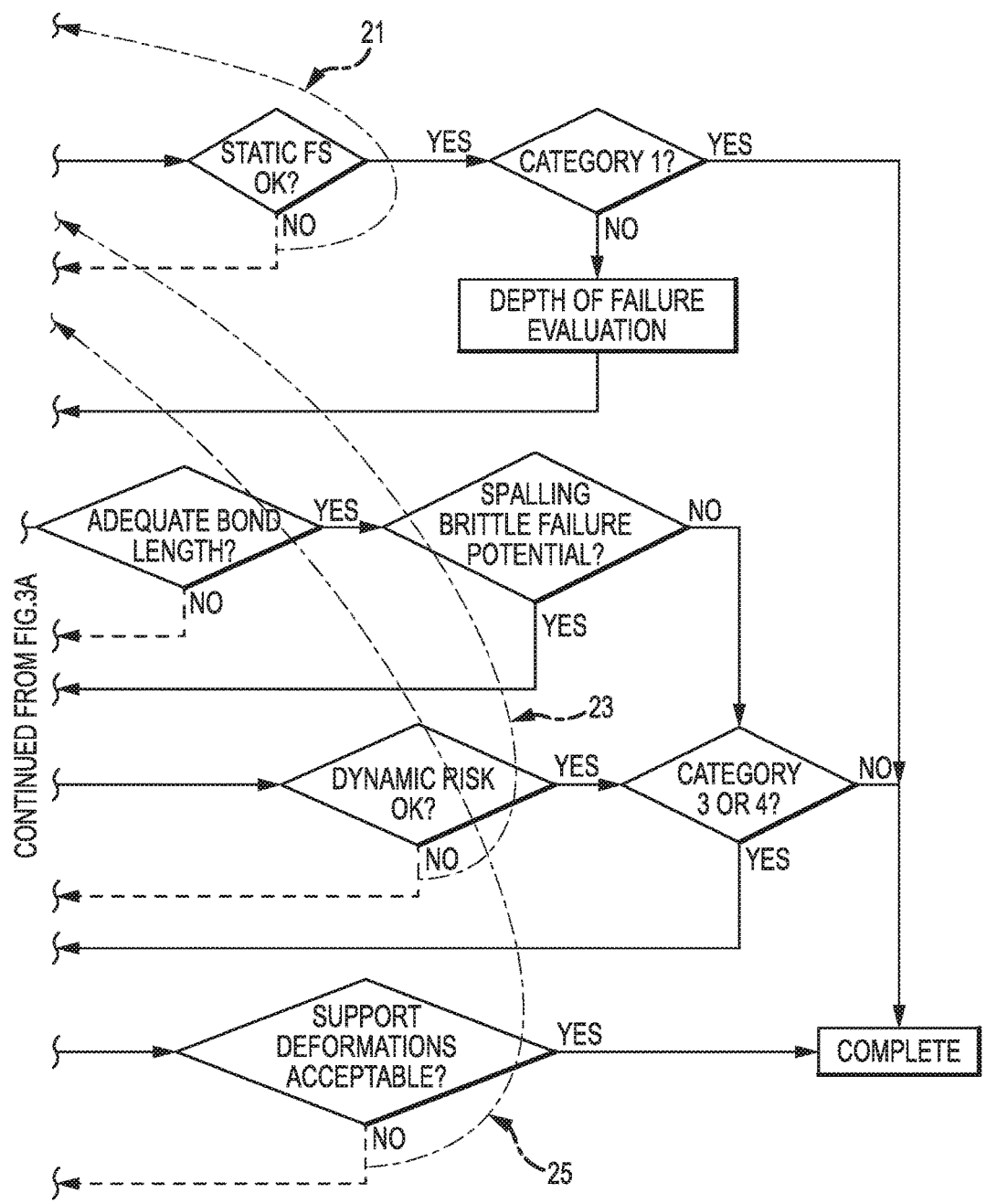
Figure 7A:
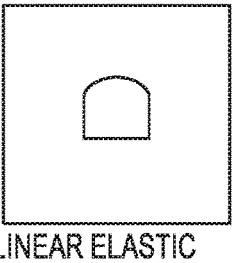
FIG. 7(a) is a pictorial representation of the various ground type categories.

Referring now to FIGS. 3 and 7a, the user may use the various tools or modules 12 and/or supplemental modules 13 of the ground support design tool 10 in conjunction with a design process or method 20 to develop ground support system designs or configurations for underground excavations. As will be described in much greater detail herein, the ground support development methodology or design process 20 provides guidance or assistance for an initial selection of ground support system configuration. Method or design process 20 also provides a means for the iterative evaluation of ground support system applicability to certain estimated geotechnical conditions and ground type categories 52 (FIG. 7). In one embodiment, the ground type categories 52 may be of types 'Category 1,' 'Category 2,' 'Category 3,' and 'Category 4.' In addition, method 20 may be used to perform rapid empirical checks for several different types of excavation failure modes. In one embodiment, the excavation failure modes may include a general kinematic (structural) instability mode, a brittle/spalling failure mode, a dynamic (e.g., bursting) failure mode, and a squeezing failure mode.

With reference now primarily to FIGS. 3(a,b), design process 20 may comprise several design iterations or process loops 54, 56, 58, 60, and 62 in which a proposed ground support system design or configuration is evaluated and/or iterated to ensure that it meets the requirements for given excavation, geotechnical, and stress conditions. Design process 20 is hierarchical depending on the particular ground type category 52 and other factors. For example, if the ground type category 52 is of type Category 1, then a ground support system design or configuration that meets certain requirements as to kinematic stability and static factor of safety will be deemed sufficient and the design process 20 complete. However, if the proposed initial ground support system design does not meet the requirements for kinematic stability and static factor of safety, then process 20 will proceed to the second design iteration loop 56. Thereafter, the user may adjust the initial ground support system design or configuration until the (now iterated or modified) ground support system design meets the requirements for kinematic stability and static factor of safety.

If the ground type category 52 is of one of the other types, e.g., Categories 2, 3, or 4, then process 20 proceeds to follow design iterations 58, 60, and 62, as depicted in FIGS. 3(*a,b*), until the ground support system design or configuration for the proposed underground excavation design meets the various criteria associated with the respective design loops 58, 60, and 62. Once the ground support system design meets the various respective criteria, the design process 20 will then be complete. However, if the changes to the ground support system configuration made during the various design iterations 54, 56, 58, 60, and 62 are unable to produce a ground support system configuration that meets the various respective criteria, then the process 20 returns, as indicated by broken lines 21, 23, and 25, to initial step 64 in which the user may change the basic configuration of the underground excavation. Thereafter, design process 20 may be followed again until the support system design for the new underground excavation configuration satisfies the requirements.

A significant advantage of the present invention is that it provides a single integrated system or tool 10 containing all of the analytical tools or modules required to develop a ground support system design that meets the requirements for given excavation, geotechnical, and stress conditions. Moreover, the information and data input to the various modules, as well as the calculations or computations performed by each module are automatically transferred or communicated among the various modules, thereby significantly streamlining the development process and significantly reducing the likelihood for errors to be inadvertently introduced during the development process. In addition, satisfactory and unsatisfactory ground support designs may be reflected immediately e.g., by the ground support system schematic tool 28. More specifically, unsatisfactory or poorly developed ground support system design elements may be indicated in the color red in the ground support schematic, thereby allowing the user to change the design 'on-the-fly' until a satisfactory indication (e.g., by use of the color green) is provided.

Still other advantages are associated with the development process 20. For example, the various design iterations or loops 54, 56, 58, 60, and 62 provide for an improved design methodology in which only those design iterations required to satisfy certain ground type categories are performed. Furthermore, the design methodology 20 provides a rationalized basis for situations for guiding a user to change or modify the underground excavation design when a satisfactory ground support design cannot be developed for a given initial underground excavation design.

Having briefly described one embodiment of the ground support design tool 10 and design process 20, as well as some of their more significant features and advantages, various embodiments and alternative configurations of the ground support design tool and design process 20 will now be described in detail. However, it should be noted that while the following description is directed to various embodiments and alternative structures and methods, other variations and modifications of the ground support design tool 10 and design process 20 will become apparent to persons having ordinary skill in the art after having become familiar with the teachings provided herein. Therefore, the present invention should not be regarded as limited to the particular structural arrangements, configurations, materials, and methods shown and described herein.

Referring back now to FIGS. 1 and 2, one embodiment of the ground support design tool 10 may be implemented on a computer system 14. Computer system 14 may be operatively associated with a display system 16 and a user input system 18. As mentioned, the various tools or modules 12 and 13 of ground support design tool may comprise an integrated system in which the various modules 12 and 13 may be displayed on display system 16 as a plurality of tabs (not shown). A system user may access the various modules by using the input system 18 to select the appropriate module by 'clicking on' the corresponding tab. The display system 16 will then display appropriate fields, information, and data associated with the selected module 12 and 13. The user may then use the display and input systems 16 and 18 associated with computer system 14 to follow the design process 20 to develop a ground support system design or configuration that is suitable for the particular underground excavation design.

As briefly mentioned earlier, the ground support system development tool 10 may comprise a plurality of tools or modules 12 that may be utilized in various combinations to assist the user in developing a ground support system design or configuration suitable for a proposed underground excavation. In the particular embodiment shown and described herein, the ground support design tool 10 may comprise an excavation detail tool or module 22, a stress estimator module tool 24, a rock mass characteristics module or tool 26, a ground support system schematic tool 28, and a wedge assessment tool 30. In addition, the ground support design tool 10 may also be provided with a number of additional modules or tools that may be utilized depending on a variety of factors. Those additional modules or tools may include a depth of failure module or tool 32, a bursting support design module or tool 34, and an intersection design tool 36. Intersection design tool 36 may comprise design tools 38 and 40 for both 3-way and 4-way intersections.

The ground support development tool 10 may also be provided with a number of supplemental tools or modules 13 to provide additional functionality. These supplemental tools or modules 13 also may be displayed on the display system 16 as one or more tabs (not shown), thereby allowing the user to readily access the various supplemental tools or modules 13 during the design process. In the particular embodiment shown and described herein, the supplemental tools or modules 13 may comprise a ground support specifications tool 42, a lookup sheet tool 44, a stress estimate output tool or module 46, a max IP tool 48, and a min IP tool 50.

Considering now the various tools or modules 12 and 13 in detail, the excavation detail module 22 may be configured to generate an underground excavation details window 66, as shown in FIG. 4. Underground excavation details window 66 may include an input data field area 68 and a system identification area 70. The input data field area 68 allows the user to input information and data relating to the size, shape, and orientation of the planned underground excavation. The system identification area 70 may be used to provide information regarding the version of the ground support design tool 10, date of evaluation, drawing number, assessment areas, and the identification of the user.

Figure 8A:
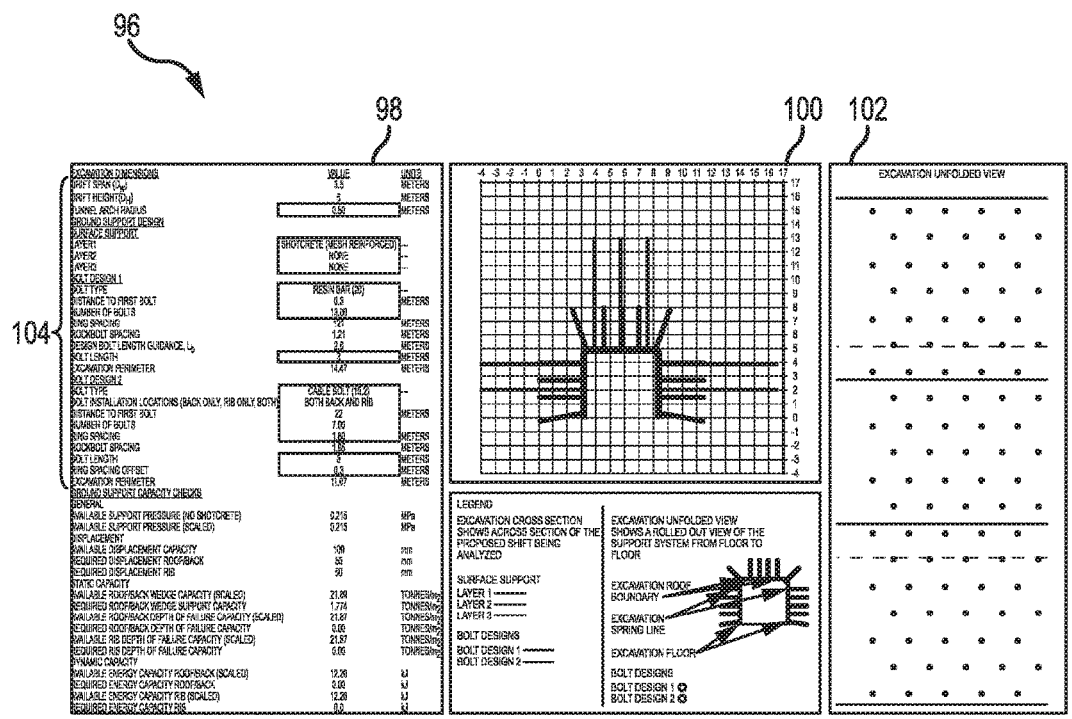
FIG. 8(a) is a pictorial representation of the design schematic window generated by the ground support design schematic module.
Figure 8C:
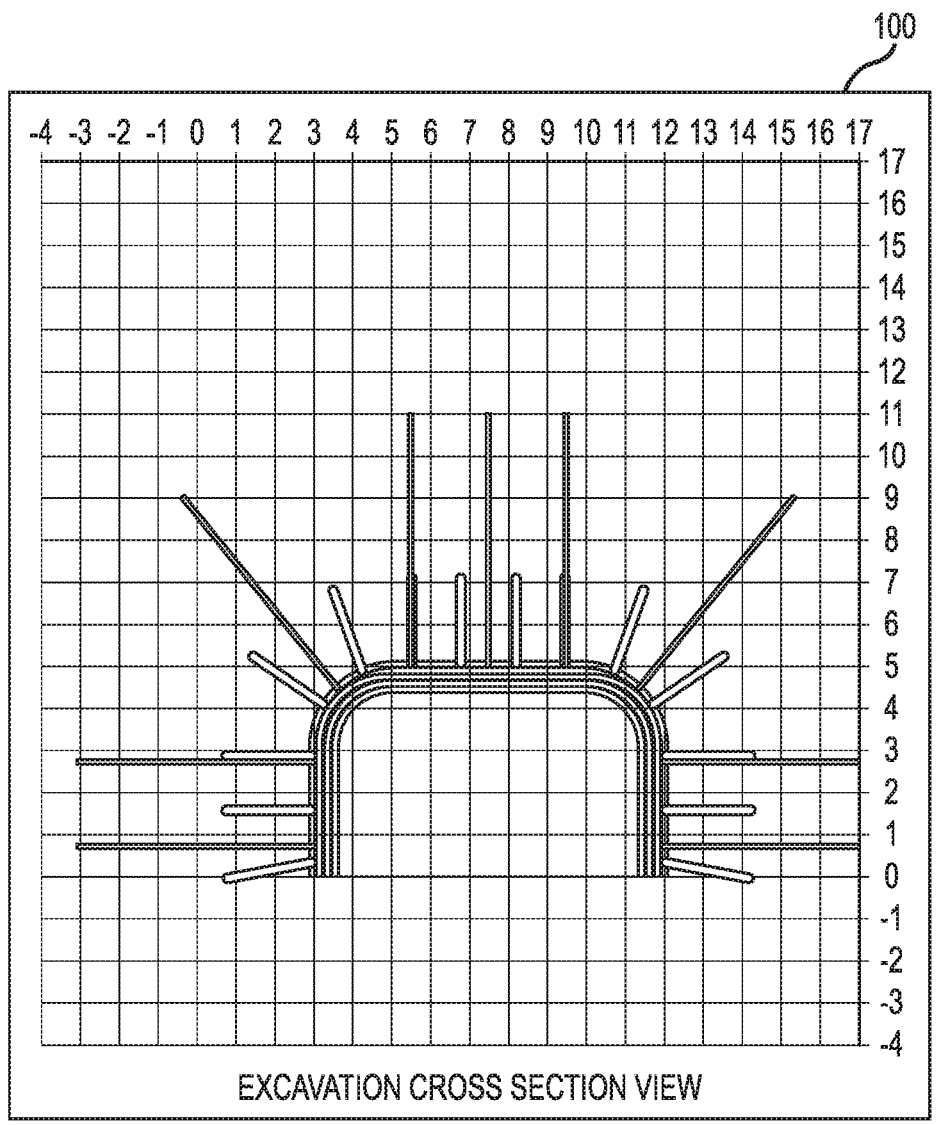
FIG. 8(c) is an enlarged view of the cross-sectional view area of the design schematic window illustrated in FIG. 8(a)

In the particular embodiment shown and described herein, the input data field area 68 includes fields for the Span, Height, Shape, Trend, and Plunge of the planned underground excavation. The input data field area 68 may also include fields for displaying the estimated equivalent radii of the roof and wall. The Span and Height of the proposed underground excavation are the width (i.e., from wall to wall) and height (i.e., from floor to roof) of the planned underground excavation. The excavation detail tool 22 may be configured to calculate or determine an equivalent radii of the roof and wall of the underground excavation based on the input values for the span and height. That is, because most underground excavations are roughly rectangular in shape (as shown in FIGS. 8*a* and 8*c*), but most empirical evaluations assume circular openings, the excavation detail tool 22 may be used to estimate an equivalent circular opening based on the span and height of the proposed underground excavation. In one embodiment, the excavation detail tool 22 estimates the equivalent radius of the roof and wall of the underground excavation according to the following equations:

$$r_{roof} = \frac{\text{Span}}{\sqrt{2}} \quad (1)$$

$$r_{roof} = \frac{\text{Height}}{\sqrt{2}} \quad (2)$$

The shape of the opening is used by other modules to calculate the tangential stresses around underground openings having certain defined shapes known in the art. In the example illustrated in FIG. 4, the shape of the underground excavation is 'Horseshoe.' The Trend of the excavation is the orientation of the underground excavation. In one embodiment, the trend is measured in degrees from mine north and ranges from 1° to 360°. The plunge is the dip or inclination of the underground excavation. A downward dip is positive, while an upward dip is negative.

The stress estimator module 24 may be operatively associated with the excavation details module 22 so that information and data may be exchanged between the two tools or modules 22 and 24. The stress estimator module 24 accepts input from the user that relates to certain stress calculation parameters. The stress estimator tool 24 calculates ground stresses in a vicinity of the underground excavation based on the input information relating to the stress calculation parameters as well as on the information about the underground excavation to be developed.

Referring now to FIG. 5(*a-i*) the stress estimator tool 24 may generate a stress estimator window 72 that may be displayed on display system 16. The stress estimator window 72 may include various regions or areas suitable for accepting required input information and data as well as various regions or areas suitable for displaying information and data relating to various stress solutions. In one embodiment, the various data input regions or areas may include a stress model query coordinates area 74, an excavation stress query area 76, an excavation stress compiler inputs area 78, and a design stress state definition area 80. See also FIGS. 5(*b-e*).

The stress model query coordinates area 74 (FIG. 5*b*) allows the user to input information regarding to the desired Horizontal and Vertical Grid Spacing to be used as input to the stress model database query as well as the mine coordinates that correspond to the approximate center of the area of interest. The Minimum and Maximum Mine Coordinates are the calculated range of coordinates to be input into the stress model database query based on the previously designated grid spacing and center coordinates.

The excavation stress query area 76 (FIG. 5*c*) includes fields relating the Excavation 'Strike' and the Excavation Plunge. These values are automatically obtained from the values provided to the excavation detail module 22 already described. The value for the Excavation Strike is the Excavation 'Trend' value provided to the excavation detail tool 22. The value for the Excavation Plunge is equal to the Excavation Plunge value provided to the excavation detail tool 22. The Iterations field allows the user to input the number of iterations to be used in the calculation of the principal and in-plane stresses from the eigenvalues and eigenvectors of the three-dimensional stress tensor. In most embodiments, this value may default to 10, although the user may input other values as well. The Stage field allows the user to input the desired stage number for the manual stress queries. The Location field corresponds to the Locations ID included in the results of the Stress Model Database query.

The excavation stress compiler inputs area 78 (FIG. 5*d*) allows the user to input the Minimum and Maximum Percentile values of the compiled data sets for which the user is interested. These values define the relative minimum and maximum values used to generate the error bars in the stress magnitude plots shown in FIG. 5*i*. This area 78 may also be provided with a Run Stress Compiler 'button' which will run a stress compiler macro. The stress compiler macro compiles the principal and in-plane stresses by stage for all queried locations from any of a range of suitable engineering models. Certain information and data required by the stress compiler macro may be automatically populated from the values in the excavation stress compiler inputs area 78. In one embodiment, the stress compiler macro may allow the user to input additional data as well.

The design stress state definitions area 80 (FIG. 5*e*) allows the user to enter the interpreted results defining the in-plane stress conditions that will be used for all subsequent design evaluations. The In-Plane Vertical and Horizontal Stress fields accept estimated in-plane vertical and horizontal stress values (in MPa).

As mentioned, the stress estimator module 24 may also produce and display information and data relating to various stress solutions. In one embodiment, the stress estimator module 24 may generate a principal stress solution area 82 and a 2D excavation stress solution area 84, as best seen in FIGS. 5*a* and 5*f*-I. The principal stress solution area 82 illustrated in FIGS. 5*f* and 5*g* may display information relating to both instantaneous and compiled data. The tabled and plotted instantaneous principal stress information provided in principal stress solution area 82 corresponds to the stress tensor for the Stage and Location input fields in the excavation stress query area 76. Tabled values indicate the magnitude and orientation of each of the principal stresses relative to the mine coordinate system. However, in this area 82, positive plunge values indicate angles above horizontal, whereas negative values are below horizontal. Area 82 may also be provided with a stereo or circle plot that presents the intersection location of the principal stress axes with an upper hemisphere projection (horizontal corresponds to the circle diameter). See FIG. 5*f*.

The compiled data plots provided in area 82 present trends of the magnitude and orientation of the major (Sigma 1), intermediate (Sigma 2), and minor (Sigma 3) principal stresses by mining stage for the queried model locations. The error bars included in the magnitude plot correspond to the range defined by the minimum and maximum percentile values entered in the excavation stress compiler inputs area

78 of the stress estimator module 22. The line plots present mean values. Trend values are relative to the mine coordinate system. The plotted plunge data follows the same convention as the instantaneous values (up is positive).

Figure 5A:
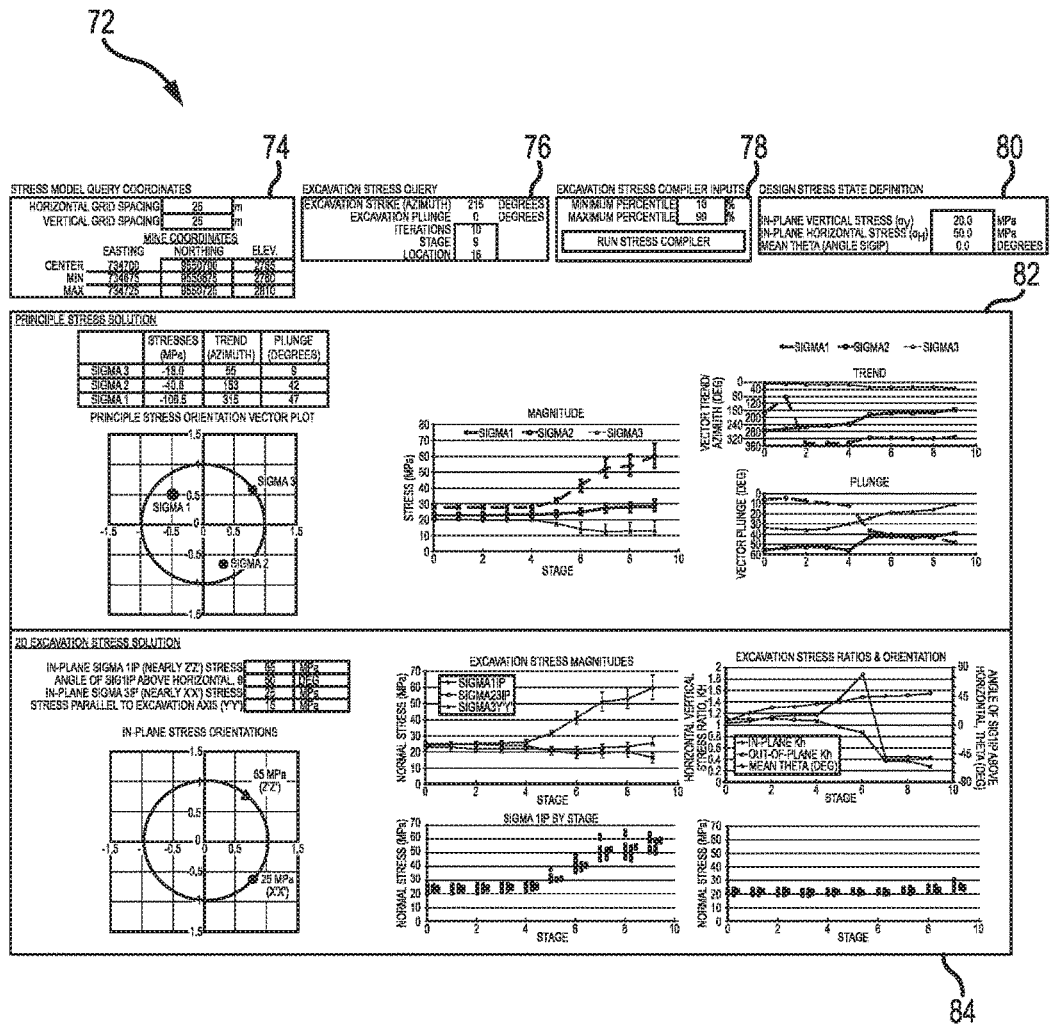
FIG. 5(a) is a pictorial representation of the stress estimator window generated by the stress estimator module.
Figures 5E, 5F:
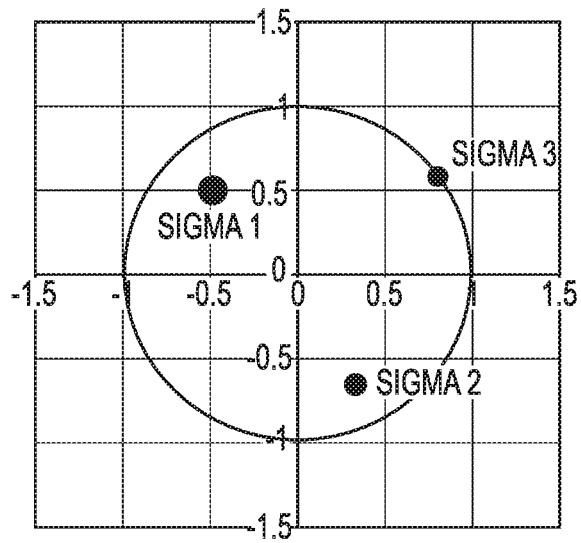
FIG. 5(e) is an enlarged view of the design stress state definition area of the stress estimator window illustrated in FIG. 5(a)
FIG. 5(f) is an enlarged view of the circle plot depicted in the principal stress solution area of the stress estimator window illustrated in FIG. 5(a)
Figure 5G:
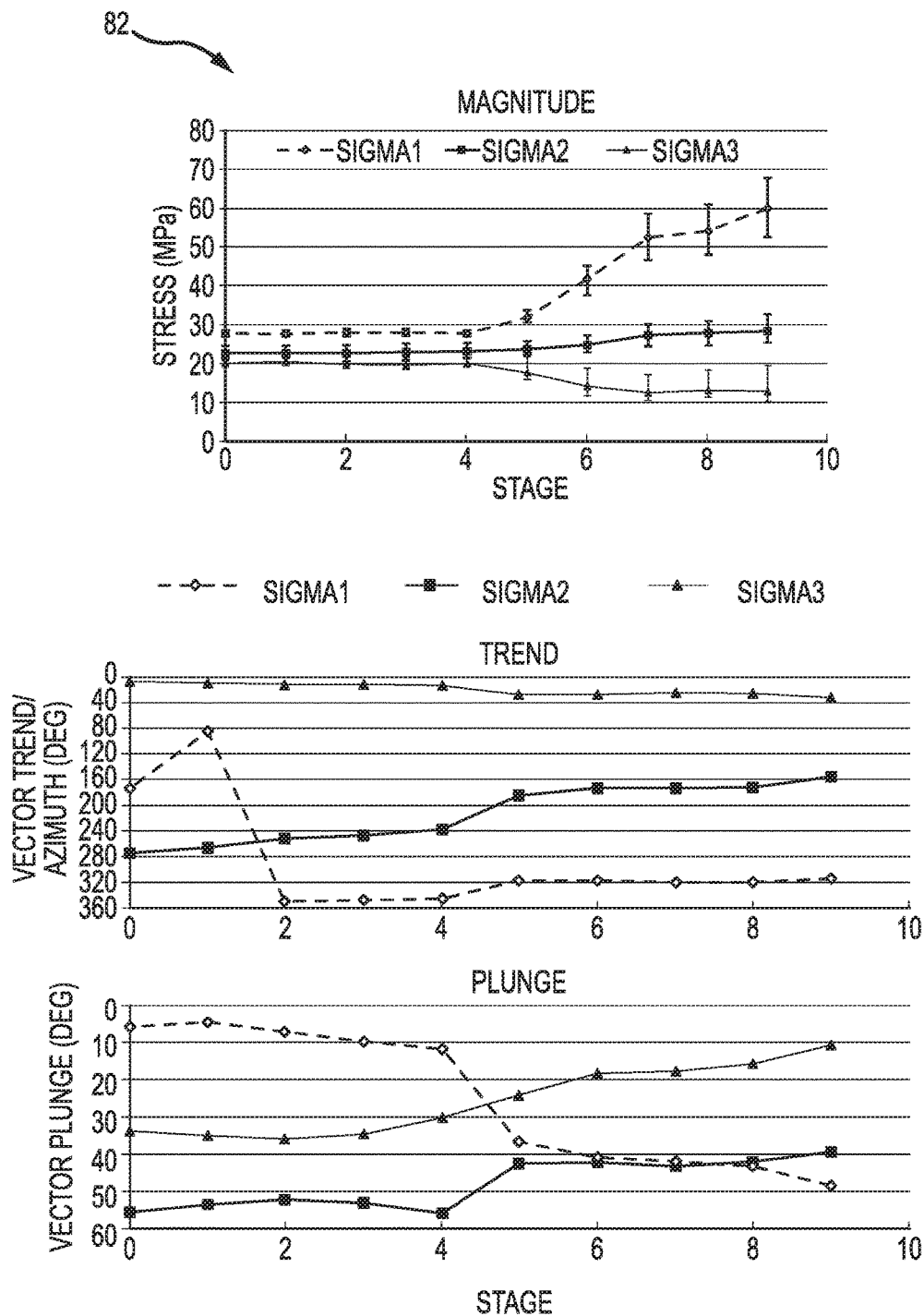
FIG. 5(g) is an enlarged view of the data plots depicted in the principal stress solution area of the stress estimator window illustrated in FIG. 5(a)
Figure 5H:
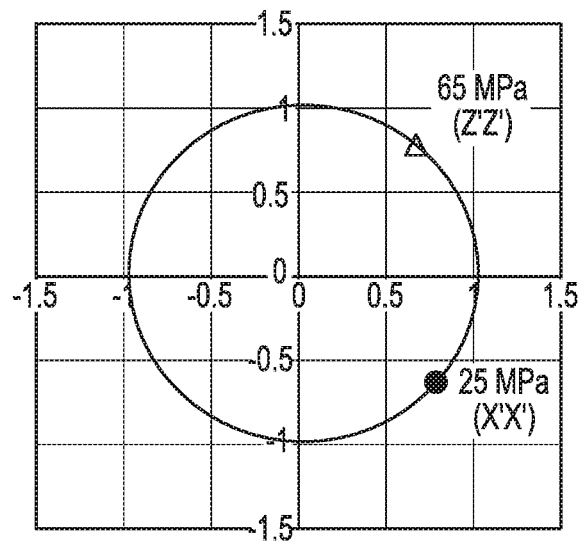
FIG. 5(h) is an enlarged view of the circle plot depicted in the 2D excavation stress solution area of the stress estimator window illustrated in FIG. 5(a)
Figure 5I:
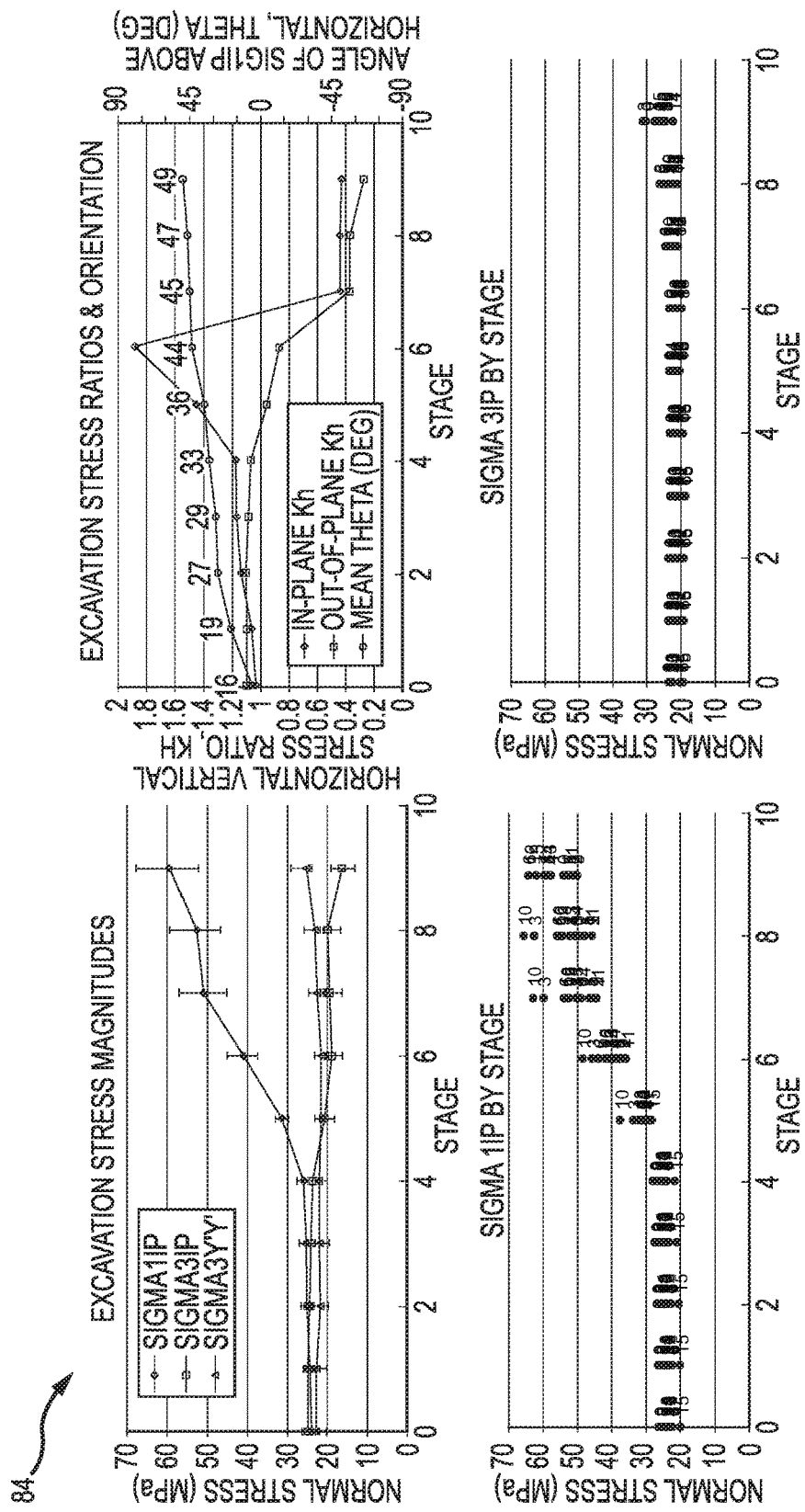
FIG. 5(I) is an enlarged view of the data plots depicted in the 2D excavation stress solution area of the stress estimator window illustrated in FIG. 5(a)

Referring now primarily to FIGS. 5h and 5i, the 2D excavation stress solution area 84 plots two-dimensional/in-plane stresses acting perpendicular to the roof/back, walls/ribs, and end walls of the defined underground excavation. As in the case of the principal stress plots provided in area 82, the 2D excavation stress solution area 84 is divided into instantaneous and compiled data types. For the instantaneous data types, the tabled values present the 2D in-plane (Sigma 1ip and 3ip) and out-of-plane (sigma y'y') stresses relative to the new excavation coordinate system. The displayed results correspond to the stress tensor for the Stage and Location defined in the excavation stress query area 76 (FIG. 5c).

Sigma 1ip and Sigma 3ip represent the in-plane maximum and minimum stress, respectively, acting in the new, x'-z' plane. This plane is oriented perpendicular to the excavation trend such that the x'-axis is horizontal and perpendicular to the underground excavation walls/ribs and the z'-axis is vertical and perpendicular to the underground excavation roof/back. The value labels also provide some indication of which in-plane stress is nearly horizontal (x'x') and which is nearly vertical (z'z'). The y'-axis parallels the excavation trend and represents the orientation of the out-of-plane stress or that acting on the underground excavation end walls.

The instantaneous data portion of the plot presents the orientation of the in-plane stress as if looking along the excavation (y'-axis) orientation. The plot thus provides an indication of the orientation of the resolved in-plane stresses relative to the excavation roof/back and walls/ribs to assist in the interpretation of stress conditions.

For the compiled data types, area 84 may include a plot of underground excavation stress magnitudes. This plot presents the average of the truncated range (between the minimum and maximum percentiles) of in- and out-of-plane stresses by mining stage. The error bars represent the significant range of values defined by the minimum and maximum percentile values entered in the excavation stress compiler inputs area 78 (FIG. 5d).

Area 84 may also include a plot of underground excavation stress ratios and orientations. This plot includes the calculated in-plane and out-of-plane $K_o$ values by mining stage based on the truncated average in- and out-of-plane stresses. $K_o$, is defined as the ratio of horizontal to vertical stress. Also plotted is the truncated average theta ($\theta$) value which is the angular orientation of Sigma 1ip above horizontal. Similar to the plotted stress magnitudes, this value represents the average of the range of values between the minimum and maximum percentile values. Trends in these plotted values provide some indication of how the orientation of in- and out-of-plane stresses change through the mining sequence relative to the underground excavation surfaces. Finally, area 84 may also include a plot of Sigma 1ip and Sigma 3ip by stage. These plots provide a more detailed presentation of the distribution of the resolved in-plane stresses. They are included as a means to verify the trends plotted in the excavation stress magnitudes plot and minimize the potential for bias from outlier values when interpreting local stress conditions.

The rock mass characteristics module 26 may generate a plurality of input fields to allow the user to input information relating to the rock characteristics for the particular underground excavation that is being developed. In one embodiment, the various inputs used to calculate the quality of the rock mass may be based on the rock mass rating system developed by Z. T. Bieniawski, as published in *Engineering Rock Mass Classifications*, Bieniawski, Z. T., John Wiley & Sons (1989), hereinafter "$RMR_{89}$", and the 'Q' rating system developed by the Norwegian Geotechnical Institute, in the publication entitled "Using the Q-System, Rock Mass Classification and Support Design," Oslo, 2013, hereinafter "NGI." An estimate of the Geological Strength Index (GSI), which may be obtained from "Predicting Tunnel Squeezing Problems in Weak Heterogenous Rock Masses," Hoek, E., and Marinos, P., *Tunnels and Tunneling International* 32, no. 11, pp. 45-51 (2000), hereinafter "Marinos and Hoek," is also required for the rock mass characteristic module 26. The input fields populated in this tab serve to define the geotechnical character of the rock mass an ultimately how the underground excavation will behave in response to in-situ and mining induced stress. In the particular embodiment shown and described herein, the rock mass characteristics module 26 estimates a ground type category 52 (FIGS. 7a and 7b) based on the input information relating to the geotechnical characteristics. As explained in further detail herein, the estimated ground type category 52 is used by method 20 (FIGS. 3(a,b)) in developing the ground system support design for the proposed underground excavation.

Figure 6A:
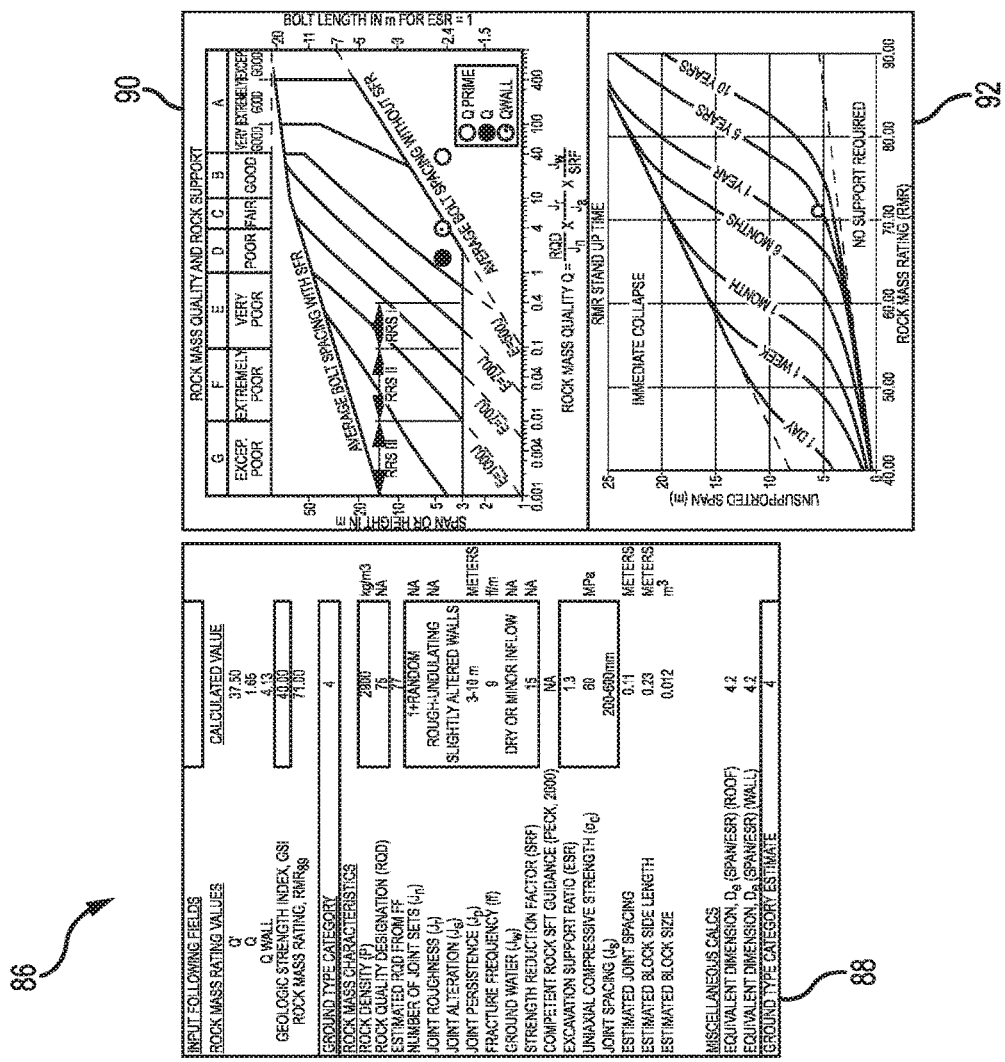
FIG. 6(a) is a pictorial representation of the rock mass characteristics window generated by the rock mass characteristics module.

With reference now to FIGS. 6(a-c) the rock mass characteristics module 26 may generate a rock mass characteristics window 86 that may be displayed on display system 16. The rock mass characteristics window 86 may include various regions or areas suitable for accepting required input information and data as well as various regions or areas suitable for displaying information and data relating to various rock mass characteristics. In one embodiment, the various data input regions or areas may include a data input area 88, a rock mass quality data area 90, and a rock mass rating data area 92.

Referring now primarily to FIG. 6b, the data input area 88 may comprise a number of input fields in which the user may input corresponding data. A first input field is a Geologic Strength Index (GSI) field that allows the user to enter an estimate of the characteristic GSI value. The data input area 88 may also include a Ground Type Category field in which the user may select the appropriate ground type category from a drop-down list based on defined geotechnical conditions. While the similar field at the bottom of data input area 88 provides an estimate of the ground support category, the user may manually define the desired category with the estimate as a guide. Data input area 88 may also include input fields to allow the user to input information and data relating to rock mass characteristics, including Rock Density, Rock Quality Designation (RQD), Number of Joint Sets, Joint Roughness, Joint Alteration, Joint Persistence, Fracture Frequency, Ground Water, Strength Reduction Factor (SRF), Excavation Support Ratio, Uniaxial Compressive Strength, and Joint Spacing. The remaining fields in the data input area 88 are calculated by the rock mass characteristics module 26 using information and computational methods well known in the art.

Figure 6C:
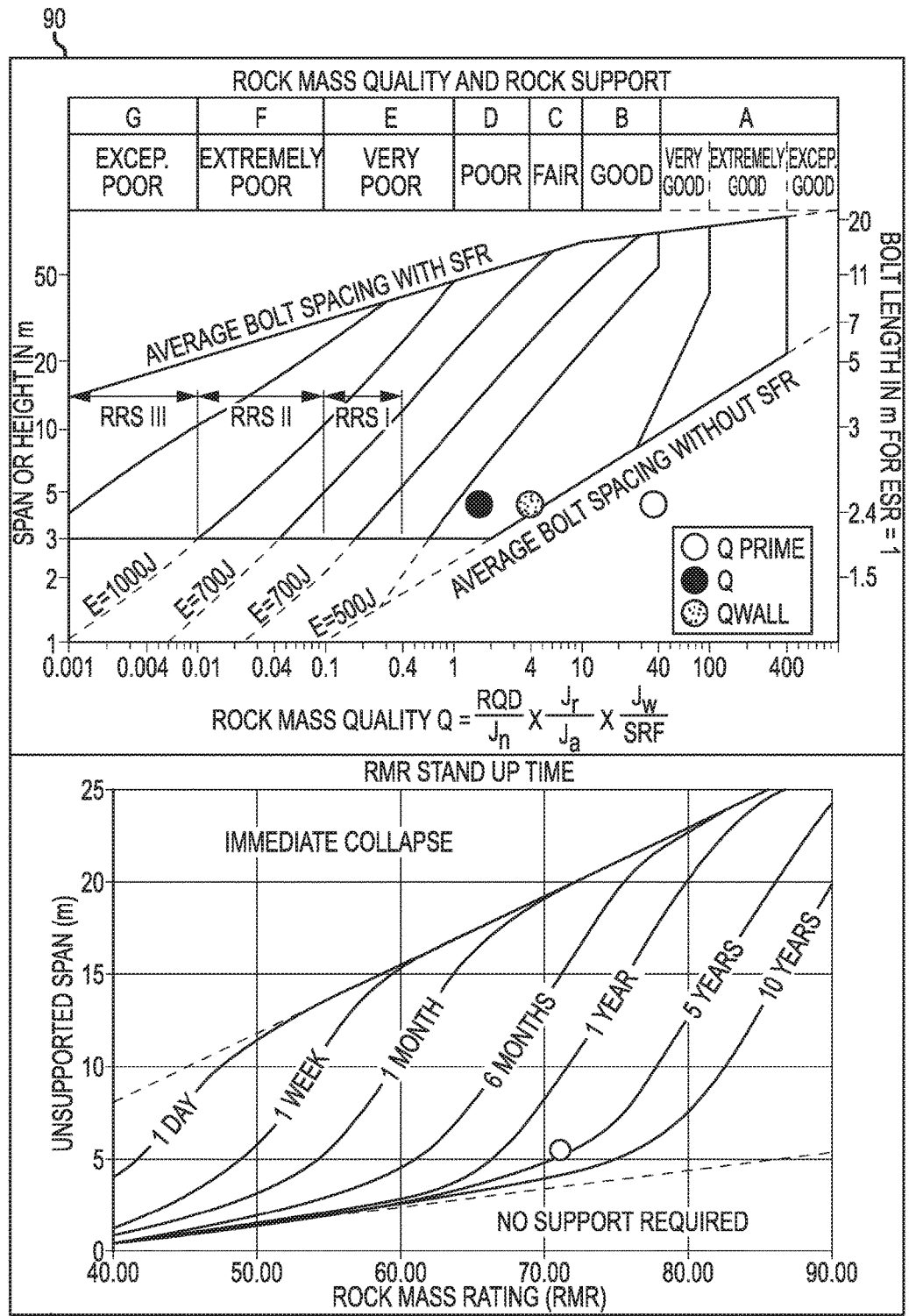
FIG. 6(c) is an enlarged view of the rock mass quality and a rock mass rating data areas of the rock mass characteristics window illustrated in FIG. 6(a)

The rock mass quality data area 90 and a rock mass rating data area 92 are best seen in FIG. 6c contain information and data useful for developing a first iteration of the ground support system design or configuration. More specifically, the rock mass quality data area 90 includes information and data in graphical form from NGI, as noted above. The rock mass rating area contains information and data also in graphical form relating to the rock mass rating system of Bieniawski, i.e., $RMR_{89}$.

Figure 7B:
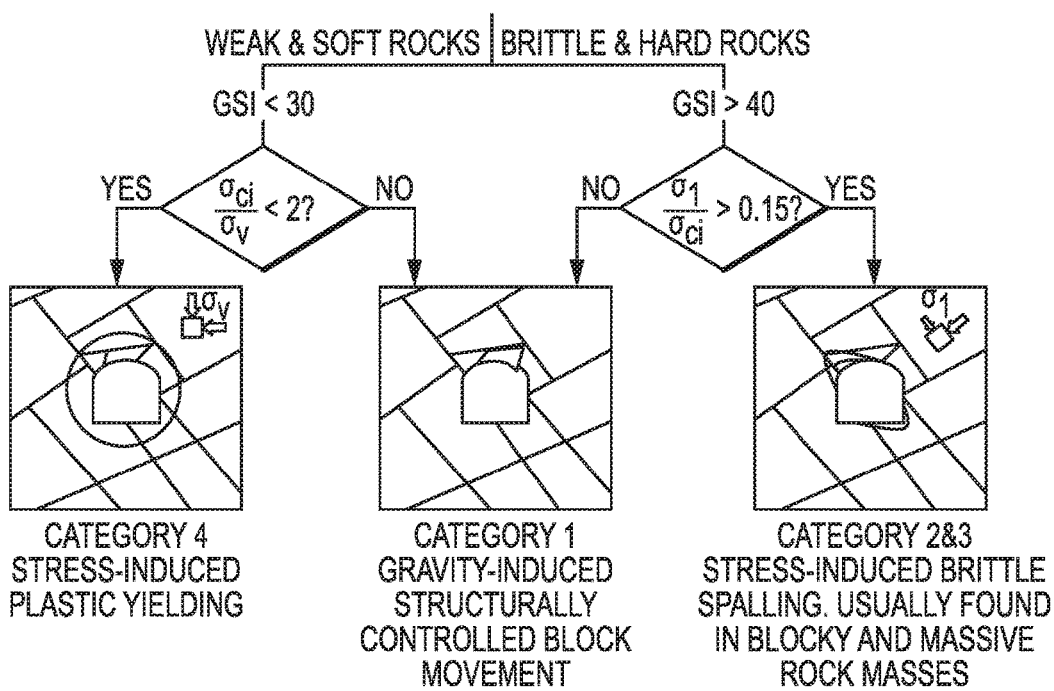
FIG. 7(b) is a graphical representation of a decision algorithm that may be used to estimate a ground type category based on geologic strength index and the ratio of compressive strengths.

As mentioned earlier, the rock mass characteristics module 26 may also be used to estimate a ground type category 52. With reference now to FIG. 7, in one embodiment, the ground type category 52 may be of types Category 1, Category 2, Categroy 3, or Category 4. This estimate is based on the calculated $RMR_{89}$ value (FIG. 6b), intact strength, and estimated in-plane stress according to the metrics provided in FIG. 7b. The in-plane stress value is taken as the maximum value of the design In-Plane Vertical and Horizontal Stresses entered in the design stress state area 80 (FIG. 5e) of the stress estimator module 24.

The ground support design schematic tool or module 28 receives information and data from the excavation detail tool 22 and causes the computer system 14 to display for the user (e.g., on display system 16) at least one schematic representation of the underground excavation to be developed. The user will typically make extensive use of the ground support design schematic module 28 during the iterative design process of method 20. The wedge assessment module 30 may be used to provide an assessment of the kinematic stability of the underground excavation to be developed.

The ground support design schematic module 28 may be configured to generate a design schematic window 96, as best seen in FIG. 8a. The design schematic window may comprise a data input and capacity check area 98, a cross-sectional view area 100, and a unfolded view area 102. It should be noted that many of the calculations performed by the ground support design schematic module 28 are directly affected by the values that are input in the ground support specification module 42 as will be discussed in further detail below.

Figure 8D:
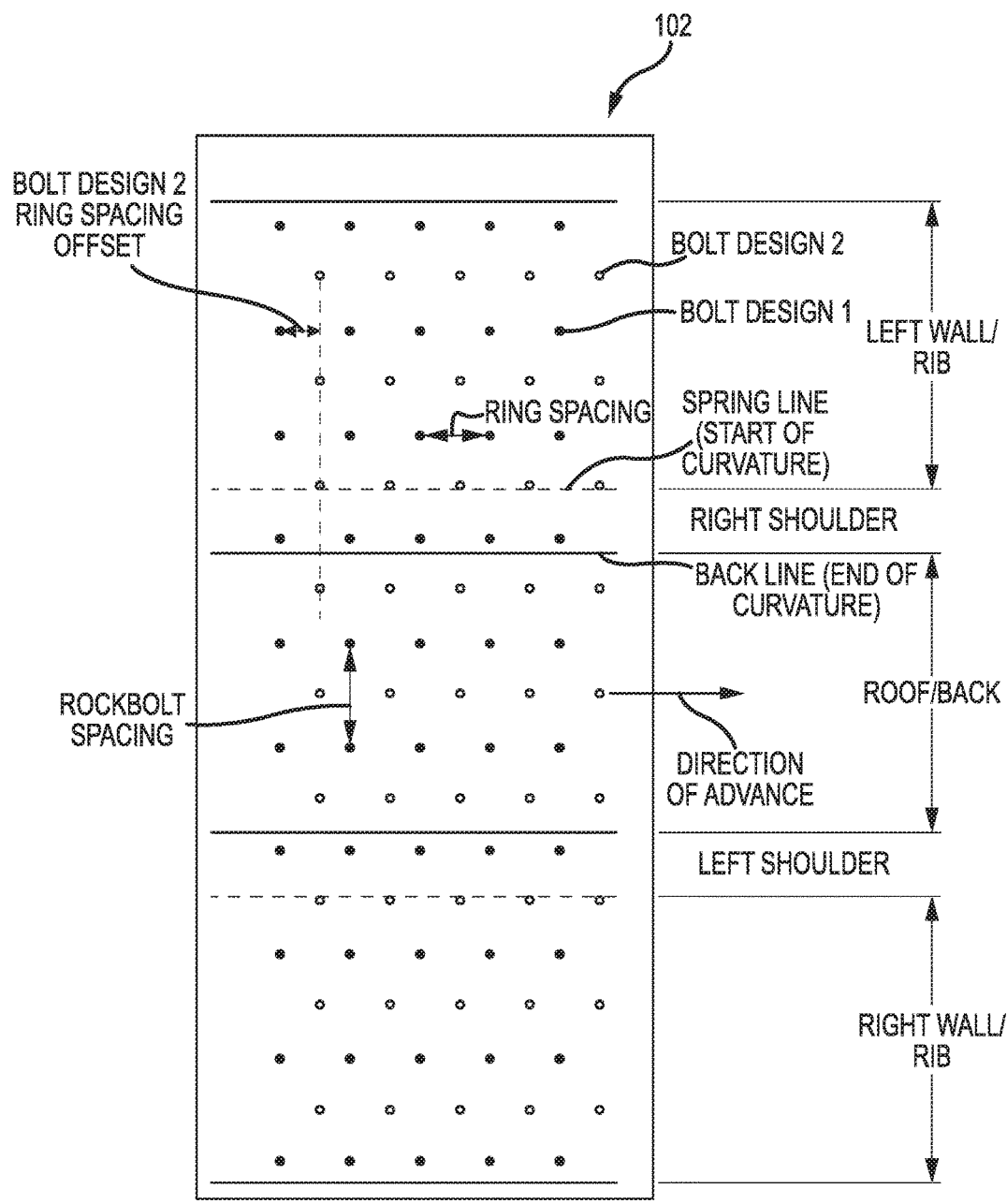
FIG. 8(d) is an enlarged view of the unfolded view area of the design schematic window illustrated in FIG. 8(a)

Referring now to FIGS. 8(b-d), the data input region of the data input and capacity check area 98 may be provided with input fields that allow the user to input information and data relating to the Excavation Dimensions, including the Span and Height of the proposed underground excavation from the excavation details module 22 and the Tunnel Arch Radius. Information and data relating to the Surface Support may also be provided. In one embodiment, details relating to the Surface Support may be provided for three layers, designated Layers 1, 2, and 3. The values selected in this input area will be reflected in the calculations and in the cross-sectional view area 100.

The user may also input information and data relating to the Bolting Systems which may include two different bolting designs, designated herein as Bolting Designs 1 and 2. See also FIG. 8d. Bolting Design 1 may include fields for specifying Bolt Type, Distance to First Bolt (i.e., the distance from the floor to the first bolt on the rib of the underground excavation), Number of Bolts, and Bolt Length. Bolting Design 2 may include fields specified for Bolting Design 1, plus additional fields. A first additional field may be Bolt Installation Locations. In one embodiment the user would select the desired location for installation of secondary bolting from a drop-down list that includes Back Only, Rib Only, or Both Back and Rib. A second additional field may be Ring Spacing Offset. Ring Spacing Offset is in reference to Bolting Design 1. If a value of zero is entered, the first ring of bolts from Bolting Design 2 will be installed in line with the first ring of bolts from Bolting Design 1. If a value greater than zero is entered, then the first ring in Bolting Design 2 will be offset from the first ring in Bolting Design 1 by the specified value.

In one embodiment, the data input into the fields for the various bolt design configurations may be immediately reflected in the cross-sectional view area 100 and the unfolded view area 102, as best seen in FIGS. 8(c-d). If desired, different colors may be used to designate the various surface support levels and bolt placements, thereby allowing the user to readily visually discern the particular system support design or configuration being evaluated.

Referring back now primarily to FIG. 8(b), the Ground Support Capacity Checks region of the data input and capacity check area 98 provides calculated data for both static and dynamic capacity checks as follows:

Design Factor of Safety:

This value represents the minimum design Factor of Safety (FS) based on the defined underground excavation use category using the following criteria:

| Excavation Use Designation | Static FS | Dynamic FS |
| --- | --- | --- |
| Zone1: High Occupancy/Exposure | 1.5 | 1.3 |
| Zone2: Medium Occupancy/Exposure | 1.3 | 1.1 |
| Zone3: Low Occupancy/Exposure | 1.2 | 1 |
| Zone4: Restricted Access | 1 | 1 |

General:

Available Support Pressure (No Shotcrete):

This is the calculated support pressure for the ground support system. It is assumed that the shotcrete does not provide any active surface pressure, and is assumed to be a tie-in element.

Available Support Pressure (Scaled):

This is the scaled support pressure based on a wedge with an apex height of ⅓ the span of the underground excavation. The term scaled means that the 'true' capacity of a bolt is that which is available from the length above the apex height of the wedge.

Displacement:

Available Displacement Capacity:

This is the max displacement value of the support system. The calculated value will appear in a color green if the ratio between it and the maximum required displacement is greater than or equal to the applicable design FS defined above. It will appear in a color red if the FS is less than the design criteria.

Required Displacement Roof/Back:

This is the estimated displacement/convergence of the roof/back taken from calculations in the depth of failure module 32. It represents the largest (i.e., maximum) estimated displacement value from the massive and heavily jointed rock mass cases.

Required Displacement Rib:

This is the estimated displacement/convergence of the rib taken from calculations in the depth of failure module 32. It represents the largest or maximum estimated displacement value from the massive and heavily jointed rock mass cases.

Static Capacity:

Available Roof/Back Wedge Capacity (Scaled):

This is the total scaled support capacity for the underground excavation roof/back. This value is calculated based on the scaled bolt capacity (i.e. capacity from length above the wedge) and the designed bolt spacing.

Required Roof/Back Wedge Support Capacity:

This is the required support capacity for a theoretical tetrahedral wedge with an apex height that is ⅓ the span of the underground excavation.

Roof/Back Wedge Factor of Safety:

Calculated as the ratio of the available, scaled capacity to the required support capacity. The calculated value will appear in a color green on the display if it is greater than or equal to the FS design criteria calculated above. It will appear in a color red on the display if it is less than the design FS.

Available Roof/Back Depth of Failure Capacity (Scaled):

This is the calculated static capacity of the support system (not including shotcrete or mesh) in the underground excavation roof/back, scaled based on the maximum depth of brittle/spalling failure from the depth of failure module 32. In order for a bolt to have its maximum capacity it must have sufficient embedment to do so. Bolts that have a length less than the depth of spalling will have zero capacity.

Required Roof/Back Depth of Failure Capacity:

This is the static capacity required for the roof/back calculated from the maximum depth of brittle/spalling failure from the depth of failure module 32 and defined rock density from the rock mass characteristics module 26.

Static Roof/Back Factor of Safety:

Calculated as the ratio of the available roof/back depth of failure capacity to the required depth of failure capacity. The calculated value will appear in a color green on the display if it is greater than or equal to the FS design criteria calculated above. It will appear in a color red if it is less than the design FS.

Available Rib Depth of Failure Capacity (Scaled):

This is the calculated static capacity of the support system (not including shotcrete or mesh) in the underground excavation ribs, scaled based on the maximum depth of brittle/spalling failure from the depth of failure module 32. In order for a bolt to have its maximum capacity it must have sufficient embedment to do so. Bolts that have a length less than the depth of spalling will be deemed to have zero capacity.

Required Rib Depth of Failure Capacity:

This is the static capacity required for the rib calculated from the maximum depth of brittle/spalling failure from the depth of failure module 32 and defined rock density from the rock mass characteristics module 26.

Static Rib Factor of Safety:

Calculated as the ratio of the available rib depth of failure capacity to the required depth of failure capacity. The calculated value will appear in a color green on the display if it is greater than or equal to the FS design criteria calculated above. It will appear in a color red if it is less than the design FS.

Dynamic Capacity

It should be noted that in most embodiments the inputs resulting in the presented values for Dynamic Capacity are somewhat subjective. Therefore, the Dynamic Capacity values will, in most instances, be useful primarily as guidelines.

Available Energy Capacity Rib/Wall (Scaled):

This is the calculated energy capacity of the wall/rib support system. The scaled designation means that the support capacity is scaled based on the maximum depth of spalling damage. So in order for a bolt to have its maximum capacity it must have sufficient embedment to do so. Bolts that have a length less than the depth of spalling will be deemed to have zero capacity. Value is in kiloJoules (kJ) and is taken from the depth of failure module 32.

Required Energy Capacity Rib:

This is the estimated energy capacity required for an event in the rib taken directly from the depth of failure module 32.

Dynamic Roof/Back Factor of Safety:

Calculated as the ratio of the available energy capacity roof/back to the required energy roof/back capacity. The calculated value will appear in a color green on the display if it is greater than or equal to the FS design criteria calculated above. It will appear in a color red on the display if it is less than the design FS.

Available Energy Capacity Roof/Back (Scaled):

This is the calculated energy capacity of the roof/back support system. The scaled designation means that the support capacity is scaled based on the maximum depth of spalling. In order for a bolt to have its maximum capacity it must have sufficient embedment to do so. Bolts that have a length less than the depth of spalling will have zero capacity. Value is in kJ and is taken from the depth of failure module 32.

Required Energy Capacity Roof/Back:

This is the estimated energy capacity required for an event in the roof/back taken directly from the depth of failure module 32.

Dynamic Rib Factor of Safety:

Calculated as the ratio of the available energy capacity rib to the required energy rib capacity. The calculated value will appear in a color green on the display if it is greater than or equal to the FS design criteria calculated above. It will appear in a color red if it is less than the design FS.

As briefly mentioned earlier, ground support design tool 10 may also be provided with a number of additional modules or tools that may be utilized depending on a variety of factors and desired functionalities. In the particular embodiment shown and described herein, such additional modules or tools may include a depth of failure module or tool 32. The depth of failure module 32 may be utilized in certain instances wherein the geotechnical characteristics of the rock make certain failure modes more probable. For example, in the particular embodiment shown and described herein, the depth of failure module 32 is used when the estimated ground type category is other than Category 1, e.g., as may be determined by the rock mass characteristics module 26. The depth of failure tool 32 generates a plurality of input fields to allow the user to input certain information, including a spalling initiation threshold. The depth of failure module 32 may also receive or utilize certain information and data from the rock mass characteristics module 26. The depth of failure module 32 may then use this information and data to determine a depth of failure for a given set of rock mass properties and stresses. The calculations performed by the depth of failure module 32 may also analyze both massive and heavily jointed rock masses.

Figure 9A:
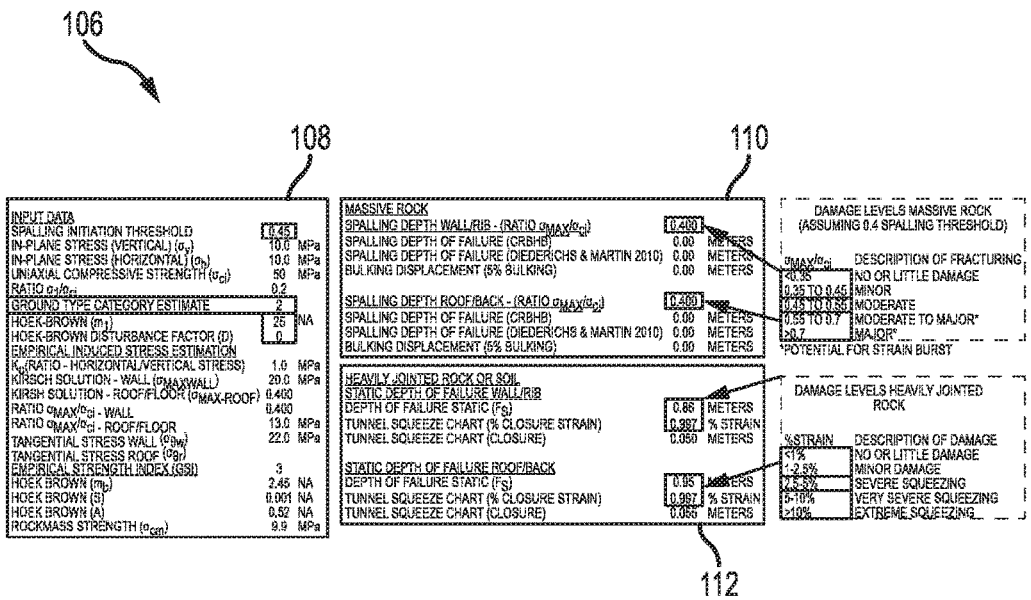
FIG. 9(a) is a pictorial representation of the depth of failure window generated by the depth of failure module.

Referring now to FIG. 9, one embodiment of the depth of failure module 32 may be configured to generate (e.g., on display system 16, FIG. 1), a depth of failure window 106. Depth of failure window 106 may include an input data field area 108, a massive rock assessment area 110, and a heavily jointed rock area 112.

In the particular embodiment shown and described herein, the input data field area 108 includes a field for input data relating to Spalling Initiation Threshold. The Spalling Initiation Threshold is the ratio of the maximum induced stress, $\sigma_{max}$, to the intact uniaxial compressive strength, $\sigma_{ci}$, at which spalling is initiated. A higher threshold means that damage will be induced at a higher stress level. This value is utilized in calculating the Spalling Depth of Failure according to the techniques published in "Measurement of Spalling Parameters from Laboratory Testing," Diederichs, M. S., and Martin, C. D., *Rock Mechanics and Environmental Engineering*, pp. 323-326, (2010), hereinafter "Diederichs and Martin." Two other data input fields are for entry of the material constant ($m_i$) for intact rock and the Disturbance Factor (D), as published in "Underground Excavations In Rock, Hoek, E. and Brown, E. T., *Instn. Min. Metal*, London, 1980, hereinafter "Hoek and Brown." The material constant value is utilized in calculating the rock mass material constant $m_b$. The Disturbance Factor ranges from 0-1 and represents that amount of damage induced into the underground excavation due to the excavation process itself. This value is used in calculating the depth of failure and anticipated strain in heavily jointed rock masses.

The remaining fields in the input data field area 108 include data automatically imported from the stress estimator module 24 and rock mass characteristics module 26, as previously described.

The depth of failure module 32 also includes fields for the Empirical Induced Stress Estimation and Empirical Rock Mass Strength Estimation, as depicted in input data field area 108. The various empirical estimates are determined by the depth of failure module 32 as follows:

Empirical Induced Stress Estimation:

For all terms within this section, the following variables are defined as follows:

$\sigma_{max}$=Maximum Tangential Stress (MPa)
$\sigma_v$=In-Plane Vertical Stress (MPa)
$\sigma_h$=In-Plane Horizontal Stress (MPa)
$\sigma_{ci}$=intact compressive strength (MPa)

$K_0$:

This is the ratio of horizontal to vertical stress. A $K_0$ value less than 1 indicates vertical stress is dominant while a $K_0$ value greater than 1 indicates horizontal stress is dominant. It is calculated from the stress values entered in the stress estimator module 24.

Kirsch Solution—Wall:

This is the maximum tangential stress in the wall of the underground excavation based on the $K_0$ ratio, the vertical stress entered in the stress estimator module 24, and the rotational angle θ relative to horizontal around the idealized, circular underground excavation:

$$\sigma_{max-wall}=\sigma_v[(1+K_0)+2(1-K_0)\cos 2\theta] \quad (3)$$

where θ=0 degrees.

Kirsch Solution—Roof/Floor:

This is the maximum tangential stress in the wall of the underground excavation based on the $K_0$ ratio, the vertical stress entered in the stress estimator module 24, and the rotational angle θ relative to horizontal around the idealized, circular underground excavation:

$$\sigma_{max-roof}=\sigma_v[(1+K_0)+2(1-K_\theta)\cos 2\theta] \quad (4)$$

where θ=90 degrees.

Ratio $\sigma_{max}/\sigma_{ci}$—Wall:

This is the ratio of maximum tangential stress (measured in MPa) that is developed in the wall of the underground excavation, divided by $\sigma_{ci}$. This ratio is utilized for assessing the depth of spalling in massive rocks.

$$\text{Stress Ratio} = \frac{\sigma_{max-wall}}{\sigma_{ci}} \quad (5)$$

Ratio $\sigma_{max}/\sigma_{ci}$—Roof/Floor:

This is the ratio of maximum tangential stress (measured in MPa) that is developed in the back of the underground excavation, divided by $\sigma_{ci}$. This ratio is utilized for assessing the depth of spalling in massive rocks.

$$\text{Stress Ration } \sigma_{max-roof}/\sigma_{ci} \quad (6)$$

Tangential Stress Roof ($\sigma_{\theta r}$):

This value is the anticipated maximum tangential roof stress (MPa) based on the shape of the underground excavation. The value is determined from the shape of the underground excavation that was selected in the rock mass characteristics module 26. The values are calculated based on the relationships provided in Hoek and Brown.

Tangential Stress Wall ($\sigma_{\theta w}$):

This value is the anticipated maximum tangential wall stress (MPa) based on the shape of the underground excavation. The value is determined from the shape of the underground excavation that was selected in the rock mass characteristics module 26. The values are calculated based on the relationships provided in Hoek and Brown.

Empirical Rock Mass Strength Estimation:

Geological Strength Index, GSI:

Value is taken from the estimated value input in the rock mass characteristics module 26. It is used as input into the Hoek and Brown rock mass strength calculation.

Hoek Brown ($m_b$):

This is the downgraded mi material constant for the rock mass, as published in "Hoek-Brown Failure Criterion—2002 Edition," Hoek, E. et al., *Proceedings of NARMS-Tac*, pp. 267-273, (2002), hereinafter "Hoek et al." This value is utilized in calculating the depth of failure and anticipated strain in heavily jointed rock masses. The value is calculated based on the GSI value.

Hoek Brown (s):

Material constant for the rock mass, according to Hoek et al. This value is utilized in calculating the depth of failure and anticipated strain in heavily jointed rock masses. The value is calculated based on the GSI value.

Hoek Brown (a):

Material constant for the rock mass, according to Hoek et al. This value is utilized in calculating the depth of failure and anticipated strain in heavily jointed rock masses. The value is calculated based on the GSI value.

Rock Mass Strength ($\sigma_{cm}$):

This is the rock mass strength calculated in accordance with the equations defined in Hoek et al.

$$\sigma_{cm} = \sigma_{ci} \frac{(m_b + 4s - a(m_b - 8s))\left(\frac{m_b}{4} + s\right)^{a-1}}{2(1+a)(2+a)} \quad (7)$$

The massive rock assessment area 110 includes calculated fields that employ the same empirical formula for both the walls/ribs and roof/back, but differing excavation induced stress inputs; the wall/rib calculations reference the 'Kirsch Solution—Wall' value while the roof/back calculations reference the 'Kirsch Solution—Roof/Floor' value. A summary of the calculated fields in this area 110 is provided below.

Before proceeding it should be noted that all estimates of the depth of failure represent the condition with no support installed. The application of support provides confinement, suppresses the spalling, and acts to reduce the depth of failure. As such, these estimates are inherently conservative.

Spalling Depth—(Ratio $\sigma_{max}/\sigma_{ci}$):

This is the ratio of $\sigma_{max}/\sigma_{ci}$ for the wall/rib or roof/back of the underground excavation. The value is calculated based on $\sigma_{ci}$ and respective Kirsch solutions.

Spalling Depth of Failure:

This is the calculated depth of failure based on the equation provided in Diederichs and Martin. The spalling parameter, which determines at what $\sigma_{max}/\sigma_{ci}$ ratio spalling initiates, can be adjusted to better correspond to site observations. The spalling parameter typically ranges from 0.4-0.5.

Bulking Displacement (5% Bulking):

This value is the anticipated displacement on the rib of the underground excavation. To calculate closure multiply the value by 2. The calculation assumes that stiff ground support is installed, which reduces the anticipated dilation/bulking to 5%.

The heavily jointed rock area 112 also employ the same empirical formula for both the walls/ribs and roof/back, but excavation induced stress inputs vary based on the respective calculations. The wall/rib solutions make use of 'In-plane Stress (Vertical) $\sigma_v$' and 'Kirsch Solution—Wall' values, while the roof/back calculations use the 'In-plane Stress (Horizontal) $\sigma_R$' and 'Kirsch Solution—Roof/Floor' values. A summary of the calculated fields in this section of the tab are provided below.

Static Depth of Failure

Depth of Failure Static (in Meters):

This value is the anticipated depth of failure for a heavily jointed or soil like rock mass under static conditions. The value is calculated based on equations presented by Hoek and Marinos.

$$\frac{d_p}{d_o} = \left(1.25 - 0.625\frac{p_i}{p_o}\right)\frac{\sigma_{cm}^{\left(\frac{p_i}{p_o} - 0.57\right)}}{p_o} \quad (8)$$

where:
$d_p$=Plastic zone radius;
$d_o$=Original tunnel radius in meters;
$p_i$=Internal support pressure
$p_0$=In situ stress=depth×unit weight of rock mass; and
$\sigma_{cm}$=Rock mass strength=2c cos φ(1-sin φ)

The rock mass strength is determined based on Hoek et al. The internal support pressure value for the calculation comes from the ground support system schematic module 28. In the case of the roof/back calculation, the support pressure used is the scaled value, meaning that the support capacity is limited to the capacity provided by the portion of the tendon embedded beyond the largest theoretical wedge block (see the 'Estimated Available Support Pressure (Scaled)' field description in the ground support system schematic module 28.

Tunnel Squeeze Chart (% Closure Strain):

This is the % closure strain value estimated using the following relationship presented in "Estimation of Tunnel Squeezing in Anisotropic Stress Fields using a FLAC-Based Neural Network," *Continuum and Distinct Element Numerical Modeling in Geomechanics*-2011, (2011), hereinafter "DeGagne et al":

$$TunnelStrain\ \% = 0.4\left(\frac{\sigma_{cm}}{\sigma_{max}}\right)^{-1.3} \quad (9)$$

where
$\sigma_{cm}$ is the rock mass strength; and
$\sigma_{max}$ is the respective maximum (wall or roof) stress from the Kirsch solutions.

Tunnel Squeeze Chart (Closure):

This calculation converts the estimated % closure strain value to a closure dimension based on the respective original underground excavation dimension (span or height).

Another module may comprise a bursting support design module or tool 34. The bursting support design tool 34 may generate a plurality of input fields to allow the user to input (e.g., via computer system 14) information relating to a bulking factor, ejection velocity of a bulking event being assessed, and an energy capacity of a proposed floor support system. The bursting support design tool then determines or estimates demands imposed on the floor support system by rapid bulking. The primary calculations assume the dominant damage mechanism is bulking with ejection resulting from a strain burst event. If desired, the bursting support design tool 34 may also produce damage estimates resulting from a burst triggered by a remote seismic event, although such functionality is not required.

Figure 10A:
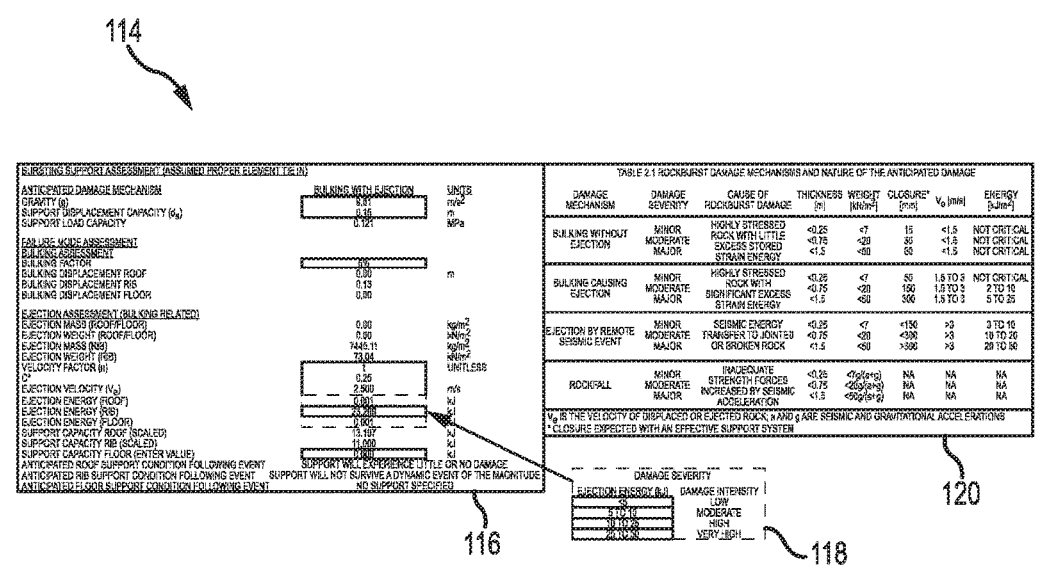

In one embodiment, the bursting support design module 34 generates or produces a bursting support design window 114 having a data input area 116, as best seen in FIGS. 10(*a-c*). The bursting support design window 114 may also be provided with one or more reference tables 118 and 120 that may be displayed to provided guidance to the user regarding various aspects, including damage severity gradation levels, rock burst damage mechanisms and the nature of the anticipated damage.

The data input area 116 provides fields for input and calculated data for failure mode assessment as follows:

Bulking Assessment:

Bulking Factor (%):

The user enters the desired bulking factor to be used in subsequent bulking calculations. This allows the user to review the effects of the bulking factor on the support systems. The following values are recommended based on support type:

No Bolting—30%
Light Bolting—7-13%
Yielding Support—4-6%
Stiff Support—1.0-2.0%

Bulking Displacement Roof:

This value is the displacement resulting from the defined bulking factor and maximum depth of failure calculated by the depth of failure module 32 for the underground excavation roof.

Bulking Displacement Rib:

This value is the displacement resulting from the defined bulking factor and maximum depth of failure calculated by the depth of failure module 32 for the underground excavation rib.

Bulking Displacement Floor:

This value is the displacement resulting from the defined bulking factor and maximum depth of failure calculated by the depth of failure module 32 for the underground excavation floor. In one embodiment, this is assumed to be equal to the roof/back failure depth.

Ejection Assessment:

Gravity:

This is the acceleration due to gravity. The default value is 9.81 m/s².

Ejection Mass (Roof/Floor):

This is the anticipated mass of rock that could be ejected during a dynamic event. The mass is estimated from the depth of failure calculated by the depth of failure module 32.

Ejection Weight (Roof/Floor):

This is the anticipated weight of rock that could be ejected during a dynamic event. The weight is estimated from the depth of failure calculated by the depth of failure module 32.

Ejection Mass (Wall/Rib):

This is the anticipated mass of rock that could be ejected during a dynamic event. The mass is estimated from the depth of failure calculated by the depth of failure module 32.

Ejection Weight (Wall/Rib):

This is the anticipated weight of rock that could be ejected during a dynamic event. The weight is estimated from the depth of failure calculated by the depth of failure module 32.

Election Velocity ($V_e$):

This is the ejection velocity of the bulking event being assessed. Experience from other mines has shown that velocities typically range from 1-3 meters per second (m/s). It is extremely difficult to predict whether ejection will occur, but some general rules of thumb can be used for assessing prior strain burst events underground. If material is ejected and is displaced beyond its angle of repose, the ejection velocity must be greater than 2 to 3 m/s. If velocities of greater than 3 m/s are anticipated a modified development sequence, distress blasting, or other method for reducing the ejection energy or likelihood of an event should be considered. Modern support systems in most cases will not survive an event with a velocity greater than 3 m/s.

Ejection Energy Calculations:

Ejection Energy (Roof/Back):

This is the calculated ejection energy for an event that occurs in the back of the underground excavation. Ejection in the roof/back takes into account the effect of gravity.

$$E = 0.5\, mv^2 + am \quad (10)$$

where

E=event energy in kiloJoules (kJ);
m=mass of ejected material as calculated previously in the Ejection Assessment section and based on the estimated spalling depth of failure;
v=the user defined ejection velocity; and
a=the defined gravitational acceleration.

Ejection Energy (Rib/Wall):

This is the calculated ejection energy for an event that occurs in the rib/wall of the underground excavation.

$$E = 0.5\, mv^2 \quad (11)$$

where

E=event energy in kiloJoules (kJ);
m=mass of ejected material as calculated previously in the Ejection Assessment section and based on the estimated spalling depth of failure; and
v=the user defined ejection velocity.

Ejection Energy (Floor):

This is the calculated ejection energy for an event that occurs in the back of the underground excavation. Ejection in the floor takes into account the effect of gravity, which reduces the event energy.

$$E = 0.5\, mv^2 - am \quad (12)$$

where

E=event energy in kiloJoules (kJ);
m=mass of ejected material as calculated previously in the Ejection Assessment section and based on the estimated spalling depth of failure; and
a=the defined gravitational acceleration.

Support Capacity Roof and Rib/Wall (Scaled):

This is the calculated energy capacity of the respective roof/back and wall/rib support systems. The scaled designation means that the support capacity is scaled based on the maximum depth of spalling. In order for a bolt to have its maximum capacity it must have sufficient embedment to do so. Bolts that have a length less than the depth of spalling will have zero capacity.

Support Capacity Floor (Scaled):

This is the calculated energy capacity of the floor support system. This value needs to be entered by the user due to the fact support is not commonly installed in the floors of the underground excavation. The value entered in this cell should be scaled similar to the others mentioned above.

In the particular embodiment shown and described herein, the severity of calculated ejection energies are ranked and colored based on the classification scheme presented in the *Canadian Rockburst Support Handbook*, Geomechanics Research Centre/MIRARCO, (1996), hereinafter "Kaiser et al," to provide a qualitative indication of the likely support system damage. The color/severity scale is outlined in the reference table 118. See FIG. 10(*b*). A strain burst that exceeds 25 kJ is very difficult to support. Modern support systems can handle a maximum of 40-50 kJ, but depends on a number of factors related to the surface support tie-in and event geometry.

As best seen in FIG. 10(*c*), reference table 120 may be displayed to provide an indication of the nature of the anticipated damage for an associated rock burst damage mechanism, thereby allowing the user to assess a potential outcome of an event. It also provides certain realistic limits for design.

Ground support development tool 10 may also be provided with an intersection design tool 36. The intersection design tool 36 may generate a plurality of input fields to allow the user to input information relating to intersections in the underground excavation design being developed and determines information relating to a required number and type of support elements for the intersections. In one embodiment, the intersection design tool 36 may comprise design tools 38 and 40 for both 3-way and 4-way intersections.

Referring now to FIGS. 11(*a-c*), the intersection design module 36 generates or produces an intersection design window 122 having a data input area 124, a failure zone calculation area 126, a design details area 128, and an intersection schematic area 130. Descriptions of the various fields and areas are provided below:

Input Data:

Factor of Safety:

This is the factor of safety that is utilized for assessing the number of tendons/rock bolts required to support a generalized, parabola shaped failure zone. See also FIG. 11*b*.

Density:

This is the density of the rock. The value is taken from the rock mass characteristics module 26. Value is in units of (kg/m$^3$).

Unit Weight:

This is the unit weight of the material. Value is in units of (MN/m$^3$).

Bolt Type:

This is the tendon/rock bolt type to be used to support the intersection. The selected type is used to determine the available support capacity and, ultimately, the number of bolts required.

Support Unit Capacity:

This is the unit capacity of the support element selected. Value is in units of (MN/m$^2$).

Drift Width-A:

This is the width of the drift that is running up and down in the figure. The value is in units of (m).

Drift Width-B:

This is the width of the drift that is intersecting drift A. Value is in units of (m).

Chamfer:

This is the distance that the intersecting drift walls/ribs are cut back in order to make a 45 degree angle. A value of zero means that it is a 90 degree intersection.

Figure 11A:
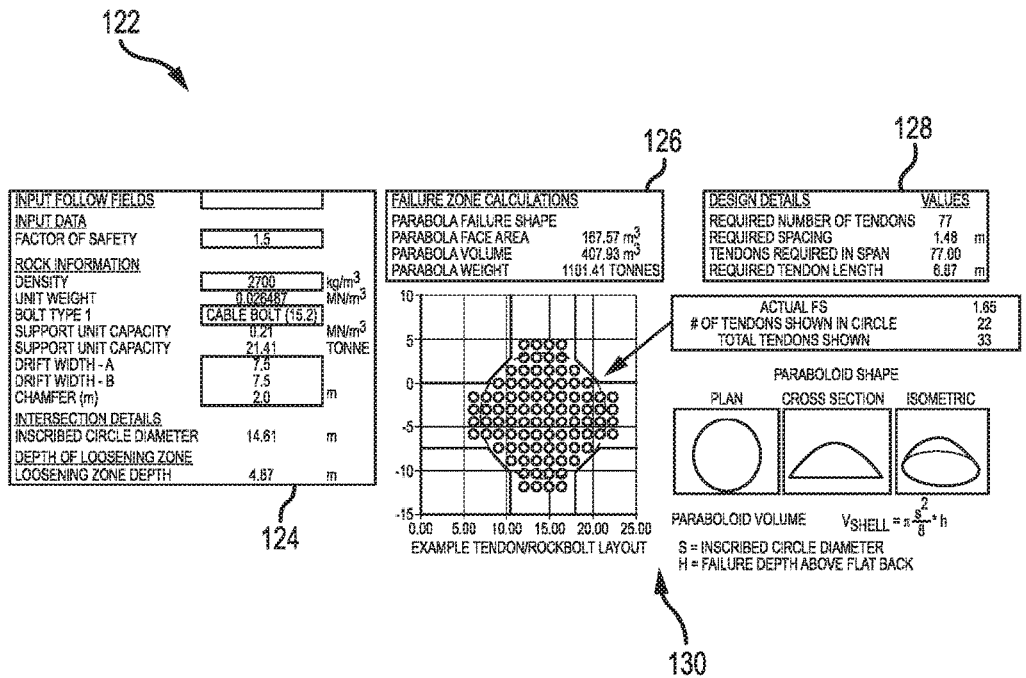
FIG. 11(a) is a pictorial representation of the intersection design window generated by the intersection design module.
Figure 11B:
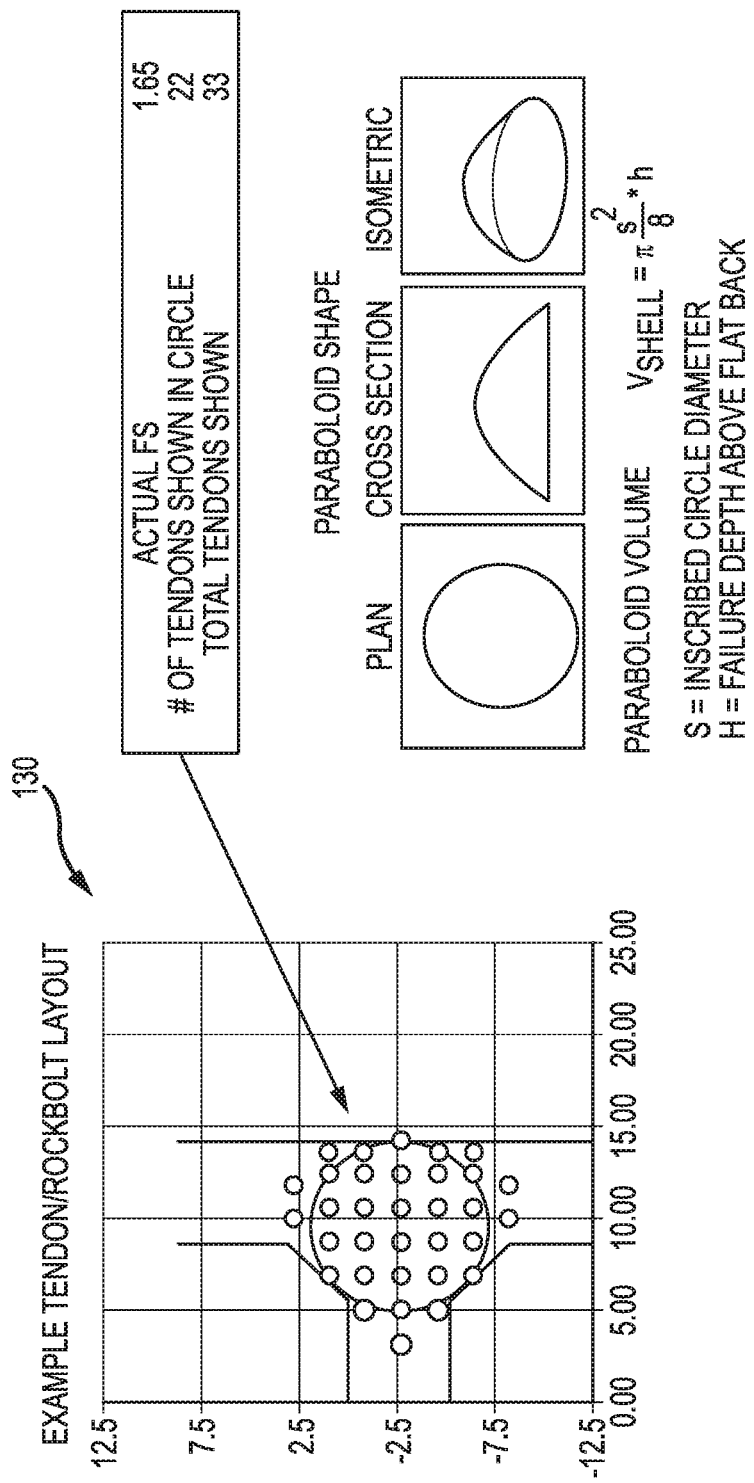
FIG. 11(b) is an enlarged view of the intersection schematic area of the intersection design window illustrated in FIG. 11(a)
Figure 11C:
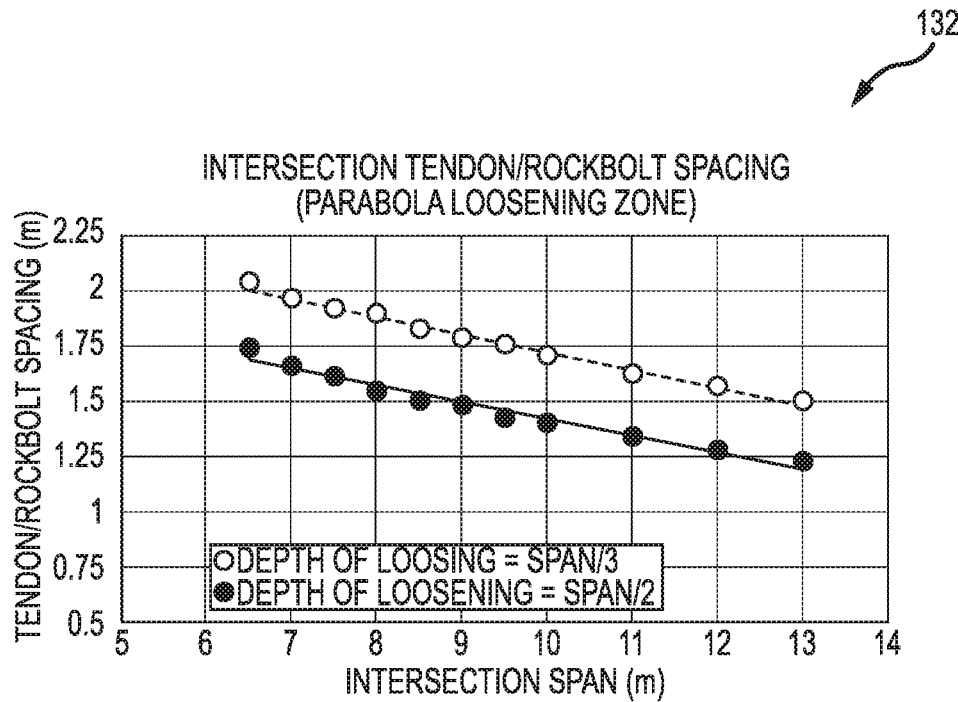
FIG. 11(c) is an enlarged view of the rock bolt spacing graph of the intersection design window illustrated in FIG. 11(a)
Figure 11D:
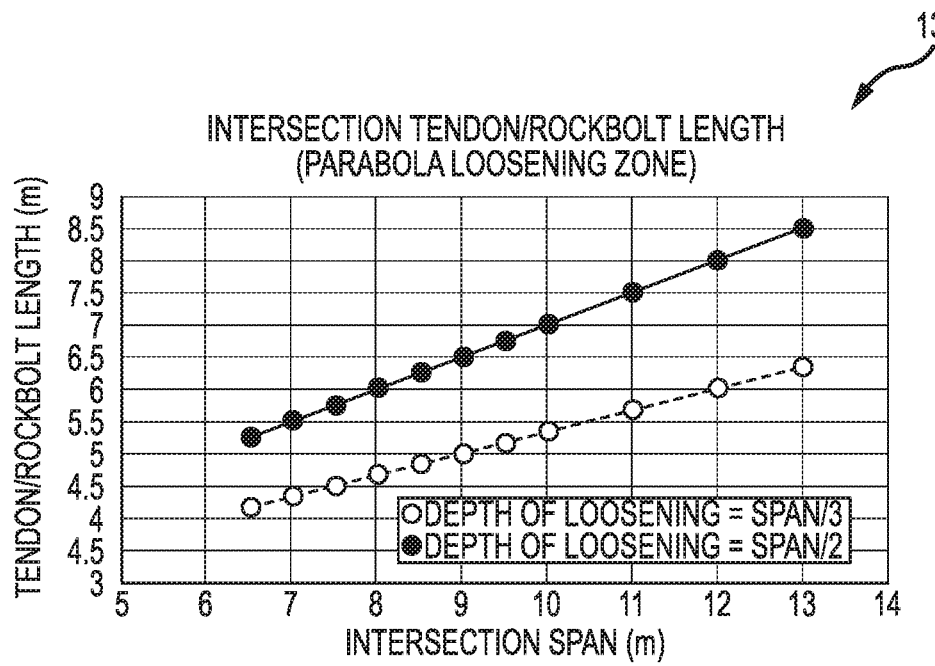
FIG. 11(d) is an enlarged view of the rock bolt length graph of the intersection design window illustrated in FIG. 11(a).

Intersection Details:
Inscribed Circle Diameter:
This is the diameter of the inscribed circle used in the calculations in meters.
Depth of Loosening Zone:
Loosening Zone Depth:
The loosening zone depth is estimated to be equal to ⅓ the inscribed circle diameter in meters.
Failure Zone Calculations:
Parabola Face Area:
This is the face area of the inscribed circle. Value is in units of (m²).
Parabola Volume:
This is the volume of a parabola that has a height ⅓ the inscribed diameter. Value is in units of (m³).
Parabola Weight:
This is the total weight of the failure zone calculated from the volume and density inputs in units of tonnes.
Design Details:
Required Number of Tendons:
This is the total number of tendons/rock bolts required to support the parabola weight based on the input factor of safety and the capacity of the defined bolt type.
Required Spacing:
This is the tendon/rock bolt spacing in meters based on the parabola face area and Required Number of Tendons field.
Tendons Required in Span:
This is the total number of tendons/rock bolts required in the inscribed circle estimate based on the calculated spacing and inscribed circle radius. This should be the same value provided in the Required Number of Tendons field.
Required Tendon Length:
This value is calculated by adding 1.5 meters to the estimated value provided in the Loosening Zone Depth field. The additional 1.5 meters is added to each tendon/rock bolt length due to general installation requirements and the need for adequate embedment to ensure full capacity.
Intersection Design Tab Figures:
With reference now primarily to FIG. 11(b), there are three separate portions of the intersection schematic area 130 to assist the user in determining the support required for the intersection. It should be noted that FIG. 11(b) depicts a conceptual bolting layout for a 3-way intersection, along with the number of tendons and corresponding factor of safety. The reason that the figure and the recommended calculations are different is due to the installation equipment constraints.
Actual Factor of Safety:
This is the factor of safety of the design depicted in FIG. 11(b). It is calculated by scaling the design factor of safety by the ratio of actual to required tendons in the inscribed circle. In some cases this design may be greater than or less than the required factor of safety. The chamfer and the drift dimensions may be changed slightly in order to get the required factor of safety.
# of Tendons Shown in the Circle:
This is the number of tendons/rock bolts depicted within the circle in the intersection schematic.
Total Tendons Shown:
This is the total number of tendons shown in the intersection schematic. As the drift approaches additional tendons should be installed outside of the circle to stabilize the intersection.
Optionally, the intersection design module 34 may also be configured to display one or more graphs 132, 134 of tendon/rock bolt spacing and length versus intersection span, as best seen in FIGS. 11c and 11d. These graphs 132 and 134 may provide the user with the ability to easily confirm the tendon and rock bold designs for a factor of safety of 1.5. A depth of loosening of span/3 and span/2 may be provided. In some poor ground positions, a span/2 may be utilized, as depicted in the graphs 132 and 134.

As briefly described above, ground support development tool 10 may also be provided with a number of supplemental tools or modules 13 to provide additional functionality. These supplemental tools or modules 13 also may be displayed on the display system 16 as one or more tabs (not shown), thereby allowing the user to readily access or toggle between the various supplemental tools or modules 13 during the design process. In one embodiment, the supplemental tools or modules 13 may comprise a ground support specifications tool 42, a lookup sheet tool 44, a stress estimate output tool or module 46, a max IP tool 48, and a min IP tool 50.

The ground support specifications tool 42 may be provided with or include strength and deformability specifications for all the available ground support components. The lookup sheet tool 44 may be provided with or include all the lookup values and many of the calculations that are performed in the background. Lookup sheet tool 44 may also be provided with or include all the formulas and arrays that are required for the visualizations in the tool. The stress estimate output tool 46 may be provided with or include the output from a stress compiler macro that may be included in the stress estimator tool 24. The output values may be those referenced by to plots presenting the results by mining stage. A number of post-processing calculations may be included in this tool as well. The macro output values may be designated from the post-processed fields by text and cell fill color. The max and min IP tools 48 and 50 may include outputs from the stress compiler macro used to generate the in-plane (ip) maximum and minimum stress plots presented in the stress estimator tool 24.

Referring back now primarily to FIGS. 3(a,b), the ground support development tool methodology or design process 20 provides guidance or assistance for an initial selection of support system components and means for iterative evaluation of system applicability to the estimated geotechnical conditions and ground type categories (i.e., Category 1, 2, 3, or 4). Specifically, the method 20 that may be used in conjunction with the ground support development tool 10 allows for rapid empirical checks for the following excavation failure modes:
General kinematic (structural) instability;
brittle/spalling failure;
dynamic (e.g., bursting) failure; and
squeezing failure.
A flowchart representation of such an iterative design process 20 is illustrating FIGS. 3(a,b).

As briefly mentioned above, design process 20 may comprise several design iterations or process loops 54, 56, 58, 60, and 62 in which a proposed ground support system design or configuration is evaluated and/or iterated to ensure that it meets the requirements for given excavation, geotechnical, and stress conditions. Design process 20 is hierarchical depending on the particular ground type category 52 and other factors, as described below. If the ground type category 52 is of type Category 1, then a ground support system design or configuration that meets certain requirements as to kinematic stability and static factor of safety will be deemed sufficient and the design process 20 complete. However, if the proposed initial ground support system design does not meet the requirements for kinematic stability and static factor of safety, then process 20 will proceed to the second design iteration loop 56. Thereafter, the user may adjust the initial ground support system design or configuration until the (now iterated or modified) ground support system design meets the requirements for kinematic stability and static factor of safety.

If the ground type category 52 is of one of the other types, e.g., Categories 2, 3, or 4, then process 20 proceeds to follow design iterations 58, 60, and 62 until the ground support system design or configuration for the proposed underground excavation design meets the various criteria associated with the respective design loops 58, 60, and 62. Once the ground support system design meets the various respective criteria, the design process 20 will then be complete. However, if the changes to the ground support system configuration made during the various design iterations 54, 56, 58, 60, and 62 are unable to produce a ground support system configuration that meets the various respective criteria, then the process 20 returns, as indicated by broken lines 21, 23, and 25, to initial step 64 in which the user may change the basic configuration of the underground excavation. Thereafter, design process 20 may be followed again until the support system design for the new underground excavation configuration satisfies the requirements.

A stepwise summary of the methods and evaluations that may be performed by the ground support design tool 10 is presented in the following sections. Prior to performing ground support design analyses, pertinent information related to underground excavation geometry, expected stress state(s), and the host rock geotechnical properties will need to be defined. These inputs are entered in various input fields generated by the various modules 12 within the ground support design tool 10.

For example, the excavation detail module 22 generates or includes input fields for entry of all details regarding the size, shape, and orientation of the underground excavation. This tool 22 may also include and/or display information regarding the version of the spreadsheet and space to document the date of evaluation, respective drawing number and assessment areas, and the user/designer.

The stress estimator tool 24 includes calculation tools for estimating the stresses likely to act normal to the underground excavation roof/back, ribs, and end walls through the mining sequence for the mine location under consideration. Inputs for these calculations may include the results of the mine-wide stress models and underground excavation orientation information, e.g., derived from numerical simulations.

In one embodiment, the general calculation steps may be as follows:
1. Select a representative mine coordinate for the underground excavation(s) of interest and determine corresponding coordinate range for query of the respective (DMLZ or GBC), gridded stress tensor results database;
2. Run the stress tensor query;
3. Input the result of the stress tensor query into the appropriate areas within the stress estimator module 24 of the ground support development tool 10;
4. Enter desired minimum and maximum percentile values within the 'Excavation Stress Compiler Inputs' area of the stress estimator tool 24;
5. Run the stress compiler macro;
6. Evaluate plotted results to determine which stage represents the worst-case as indicated by the least favorable combination of in-plane stress magnitude and anisotropy (KH=H:V). The following factors should be considered in this evaluation:
    a. If the in-plane KH=1 indicates isotropic stress conditions (horizontal=vertical).
    b. Where in-plane KH>1, horizontal stress is greater than vertical and the stress conditions in the roof/back and floor will be most significant.
    c. Where in-plane KH<1, horizontal stress is less than vertical and the stress conditions in the walls/ribs will be most significant. However, where this is the case, potential for gravity failure of roof/back blocks may increase as a result of lost confinement;
7. Input worst-case combination of in-plane stress into the Design Stress State Definition area of the stress estimator module 24. These values are those referenced by other modules for estimation of induced stress and depth of rock mass failure.

Rock mass characteristics are defined in the rock mass characteristics module 26. In one embodiment, the various inputs are used to calculate rock mass quality based on the $RMR_{89}$ system and the NGI Q rating systems. An estimate of the Geological Strength Index (GSI) from Marinos and Hoek is also required in this module 26. The input fields generated (and populated) in this module 26 serve to define the geotechnical character of the rock mass and ultimately how the underground excavation will behave in response to in-situ and mining induced stress.

I. Design Iterations #1/#2 (Kinematic Stability)

Once the analysis inputs have been defined, as described above, the empirical support design charts presented in the rock mass characteristics module or tool 26 can be used to develop an initial ground support system design. The system is constructed from available components in the ground support system schematic module or tool 28.

In the first design iteration 54, the initial design may then be checked for kinematic stability using the generic wedge calculations performed by the generic wedge assessment module or tool 30 and may be summarized in the 'Support Capacity Checks' area of the ground support system schematic module 28.

If site specific structural information is available, an analysis may be performed using the 'Unwedge' computer program available from Rocscience, Inc., of Toronto, ON (Canada) to verify the suitably of the initial support design. If the static factor of safety (FS) for this design iteration meets the respective design criteria for the excavation type, then the ground support system will meet the required demand and the design process is complete. If the static factor of safety (FS) does not meet the minimum criteria, then the second design iteration 56 is performed.

Commonly, adjusting support spacing and length will work to mitigate potential static failures. In the second design iteration 56, these inputs may be adjusted iteratively in the ground support system schematic module 28 until an acceptable factor of safety is achieved. If a reasonable combination of components cannot be determined, it may be necessary to adjust the dimensions, shape, and/or orientation of the underground excavation, as indicated by path 21.

As mentioned, if the combination of geotechnical and stress conditions indicates the ground type is Category 1 (i.e. structurally controlled failure mechanisms only), as estimated by the rock mass characteristics module 26, designing for a static, structurally controlled failure is all that is necessary. The process 20 is deemed complete. For the other ground support categories (Categories 2-4), additional evaluations or iterations 58, 60, and 62 are required.

II. Design Iteration #3 (Depth of Failure)

Excavations in ground types other than Category 1 require an assessment of the potential for the induced stress to cause rock mass failure around the underground excavation. These steps may be performed in the third design iteration 58. Empirical estimates of the depth of rock mass failure are presented by the depth of failure module or tool 32. In the particular embodiment shown and described herein, calculated failure depths and associated displacements/closure are given for two mechanisms:

1. Brittle/Spalling failure of massive rock, and
2. Plastic deformations of heavily jointed rock.

These two mechanisms represent the two end-members of stress induced failure and associated deformations. A review of the estimated ground type category and the qualitative damage scales provided for each of these mechanisms provides some indication of which is the more likely for the given conditions.

Once the predominate rock mass failure mechanism is identified, the tendon components of the ground support system should be adjusted to ensure adequate anchorage beyond the estimated failure depth for both the ribs and back/roof. As a general rule of thumb, the minimum anchorage length beyond the failure zone is considered to be ⅓ the total bolt length. It will be important to calibrate the estimated depths with site-specific experience and engineering judgement to ensure tendon lengths are adjusted appropriately.

Once the anchorage depths have been adjusted, the relative degree of potential for spalling/brittle failure may be assessed using the qualitative rating system defined for massive rock in the Depth of Failure module 32. If the indicated damage level is 'Moderate to Major,' it will be necessary to evaluate the dynamic demands on the ground support system. If the indicated damage level is 'Moderate' or less and the estimated ground type is not Category 3 or 4, then the current ground support system design will adequately meet the anticipated support demands. Again, design process 20 is deemed to be complete.

III. Design Iteration #4 (Brittle/Dynamic)

When the combined rock mass characteristics and stress conditions indicate potential for 'Moderate' to 'Major' brittle/spalling damage of massive rock, it is necessary to evaluate the dynamic capacity of the ground support system. These steps may be performed in the fourth design iteration 60. The calculated values presented by or in the bursting support design tool or tab 34 provide an empirical estimate of the ejection energy due to bulking associated with a potential strain burst in massive, brittle rock.

The estimated ejection energy is compared to the total absorption capacity of the support system to give a relative indication of dynamic suitability of the system. If significant disparity is indicated between the available dynamic capacity and the estimated ejection energy, the ground support system should be modified. The support system must be able to displace in order to contain the rapid onset of bulking. If the support system is too stiff, it will be overloaded and fail. Stiff support will suppress the bulking process, but offers little displacement capacity required for dissipating the energy associated with a dynamic event. Some guidance with regard to appropriate support systems for typical dynamic loadings is provided within the bursting support design module or tool 34.

In these evaluations of dynamic suitability it is also important to consider the respective risk associated with the underground excavation(s) under consideration. For instance, the risk to miners and equipment from a strain-burst in a drainage drift is low. Accordingly, it would not be practical to design a ground support system with high energy absorption capacity despite the damage rating estimated by the bursting support design module or tool 34.

It is also possible that a reasonable ground support system cannot be designed to address the dynamic support requirements for the given excavation, geotechnical, and stress conditions. Where this is the case, changes to excavation shape, size, and/or orientation may be necessary, as indicated by design path 23. Specialized excavation methods such as de-stress blasting may also need to be considered.

IV. Design Iterations #4/#5 (Squeezing/Bulking)

If the ground type estimation and results of the depth of failure module 32 indicate potential for squeezing rock mass failure it will be necessary to check that the design ground support system is capable of maintaining adequate support capacity at large strains. These steps may be performed in design iteration 62. This factor is most readily assessed by reviewing the displacement capacity check in the ground support system schematic module 28.

Similar to the case of dynamic, brittle/spalling type failure mechanism, it is possible that no combination of support elements will match the predicted underground excavation deformations. In these cases, it may be necessary to consider changes to underground excavation shape, size, and/or orientation, as indicated by design path 25. Alternatively, damage caused by squeezing conditions can also be managed by periodic support system rehabilitation. However, the intended underground excavation use and service life need to be considered when determining if periodic rehabilitation is a reasonable approach to managing large ground displacements.

Secondary Intersection Support Design

The ground support design tool 10 may also be provided with an intersection design module 36 that will provide for the rapid evaluation of requirements for secondary support in 3-way and 4-way intersections. These analyses tools are included in respective intersection design (3-way) and intersection design (4-way) modules 38 and 40.

The input values and calculations in these modules estimate the number of secondary tendons needed in order to meet a specified factor of safety. It is assumed in this assessment that the surface elements assist in distributing the load to the tendons installed. The surface support does not significantly add to the integrated support system, and therefore may be ignored in the calculation. The calculation assumes that a zone of loosening/failure develops in the form of a parabola, which can be described by the following equation:

$$V_{shell} = \pi\left(\frac{s^2}{8}\right)h \qquad (13)$$

where:
s=the inscribed circle diameter; and
h=the failure depth above flat back.

Design iterations are conducted by varying the underground excavation and chamfer dimensions slightly until a reasonable distribution of tendons is indicated by the example layout, the calculated spacing is between 1.4 and 2 meters, and the actual factor of safety meets or exceeds the designated design factor of safety.

The tendon lengths have been determined based on the following definitions:
Good/Fair Ground=Span (meters)/3+2 meters; and
Poor Ground=Span (meters)/2+2 meters.

Tendon lengths have been extended by 2 meters past the anticipated depth of loosening to ensure there is sufficient bonded length to engage the full capacity of the support elements. As an example, an 8 meter span in good ground would require a tendon length of 4.6 meters. This can be rounded to 5 meters for operational ease of design and installation.

It is assumed in the calculations that the secondary support system works in combination with the surface support elements (mesh, shotcrete, etc.) in holding the mass of material in place. It is also assumed that the surface support elements do not significantly contribute to the overall capacity of the support system, but connect the various elements of the secondary bolting system so that loads are effectively distributed.

In the example, an additional row of secondary support may be installed just outside the measured span in each of the drifts that make up the intersection. This will ensure that the intersections do not become unstable due to ground movement in the near vicinity of the intersection. The spacing of the additional tendon should be the same as the those installed within the intersection span. A minimum of two (2) tendons must be installed in each of the adjoining drifts.

Having herein set forth preferred embodiments of the present invention, it is anticipated that suitable modifications can be made thereto which will nonetheless remain within the scope of the invention. The invention shall therefore only be construed in accordance with the following claims:

The invention claimed is:

1. A computer implemented method of designing a ground support system for an underground excavation, comprising:
    developing a plurality of input parameters for the underground excavation, the input parameters relating to one or more of an excavation geometry; expected stress states; and geotechnical properties of host rock;
    performing, using a computer, a first design iteration to determine an initial ground support system design;
    evaluating, using the computer, a kinematic stability of the initial ground support system design;
    determining, using the computer, whether the kinematic stability meets a predetermined factor of safety;
    reiterating the initial ground support system design until the kinematic stability meets the predetermined factor of safety;
    using the input parameters relating to geotechnical properties of host rock to produce, using the computer, a ground type estimate, the ground type estimate being selected from the group consisting of Category 1, Category 2, Category 3, and Category 4; and
    wherein said method further comprises concluding, using the computer, said method when the determined ground type estimate is Category 1.

2. The method of claim 1, further comprising conducting additional design iterations when the determined ground type category is any one of Category 2, Category 3, or Category 4.

3. The method of claim 2, wherein said additional design iterations comprise one or more evaluations selected from the group consisting of:
    a depth of failure evaluation;
    a spalling/brittle failure evaluation; and
    a bursting a depth of failure evaluation.

4. A ground support design system, comprising:
a display system;
an input system; and
a computer system, said computer system being operatively associated with said display system and said input system, said computer system further comprising:
    an excavation details tool, said excavation details tool generating on said display system a plurality of input fields to allow the user to use said input system to input information relating to an underground excavation to be developed;
    a stress estimator tool operatively associated with the excavation details tool, said stress estimator tool generating on said display system a plurality of input fields to allow the user to use said input system to input information relating to stress calculation parameters, said stress estimator tool calculating ground stresses in a vicinity of the underground excavation based on the input information relating to stress calculation parameters and the underground excavation to be developed;
    a rock mass characteristics tool, said rock mass characteristics tool generating on said display system a plurality of input fields to allow the user to use said input system to input information relating to geotechnical characteristics of rock mass adjacent the underground excavation, said rock mass characteristics tool estimating a ground type category based on the input information relating to the geotechnical characteristics;
    a ground support system schematic tool, said ground support system schematic tool operatively associated with said excavation details tool, said ground support system schematic tool generating on said display system at least one schematic representation of the underground excavation to be developed;
    a wedge assessment tool operatively associated with said excavation details tool, said stress estimator tool, said rock mass characteristics tool, and said ground support system schematic tool, said wedge assessment tool estimating support requirements for the underground excavation to be developed, said wedge assessment tool producing information relating to a kinematic stability of the underground excavation to be developed, wherein said computer system automatically transfers information among said tools comprising said ground support design system so that said ground support design system comprises an integrated system for developing the support system design, and wherein said computer system provides a nearly immediate visual indication on said display system that the developed support system design simultaneously meets requirements for the estimated ground type category, the calculated ground stresses, and the kinematic stability of the underground excavation to be developed;
    a depth of failure tool, said depth of failure tool operatively associated with said stress estimator tool and said rock mass characteristics tool, said depth of failure tool generating on said display system a plurality of input fields to allow the user to use said input system to input information relating to a spalling initiation threshold, said depth of failure tool estimating a depth of failure based on rock mass properties and stresses; and
    a bursting support design tool, said bursting support design tool operatively associated with said ground support system schematic tool and said depth of failure tool, said bursting support design tool generating on said display system a plurality of input fields to allow the user to use said input system to input information relating to a bulking factor, an election velocity of a bulking event being assessed, and an energy capacity of a floor support system, said bursting support design tool estimating demands imposed on the floor support system by rapid bulking.

5. The ground support design system of claim 4, further comprising an intersection design tool, said intersection design tool generating on said display system a plurality of input fields to allow the user to use said input system to input information relating to intersections in the underground excavation to be developed, the intersection design tool determining information relating to a required number and type of support elements for the intersections.

6. A computer implemented method of designing a ground support system for an underground excavation, comprising:
developing a plurality of input parameters for the underground excavation;
estimating, using a computer, a ground type category, the ground type category being selected from the group consisting of Category 1, Category 2, Category 3, and Category 4;
performing, using the computer, a first design iteration to determine an initial ground support design;
evaluating, using the computer, a kinematic stability of the initial ground support design;
determining, using the computer, whether the kinematic stability meets a predetermined factor of safety; and
completing, using the computer, the ground support design when the initial ground support system meets the predetermined factor of safety and when said estimated ground type category is Category 1.

7. The method of claim 6, further comprising reiterating the initial ground support design if the kinematic stability of the initial ground support design does not meet the predetermined factor of safety.

8. The method of claim 7, further comprising:
reevaluating the kinematic stability of the reiterated ground support design; and
determining whether the kinematic stability of the reiterated ground support design meets the predetermined factor of safety; and
completing the ground support design when the reiterated ground support design meets the predetermined factor of safety.

9. The method of claim 6, further comprising conducting a third design iteration when the estimated ground type category is not Category 1.

10. The method of claim 9, wherein said third design iteration comprises performing a depth of failure evaluation.

11. The method of claim 10, wherein said third design iteration further comprises:
performing a spalling/brittle failure evaluation; and
completing the ground support design when the reiterated ground support design passes the spalling/brittle failure evaluation and when said estimated ground type category is of Category 2.

12. The method of claim 11, further comprising conducting a fourth design iteration when the reiterated ground support design does not pass the spalling/brittle failure evaluation.

13. The method of claim 12, wherein said fourth design iteration comprises performing a bursting depth of failure evaluation.

14. The method of claim 13, wherein said fourth design iteration further comprises:
performing a dynamic risk assessment; and
completing the ground support design when the reiterated ground support design passes the dynamic risk assessment and when said estimated ground type category is of Category 2.

15. The method of claim 14, further comprising conducting a fifth design iteration when the reiterated ground support design passes the dynamic risk assessment and when the estimated ground type category is of Category 3 or Category 4.

16. The method of claim 15, wherein said fifth design iteration comprises performing a squeezing/bulking evaluation.

17. The method of claim 16, wherein said fifth design iteration further comprises:
determining whether support deformations are acceptable; and
completing the ground support design when the support deformations of the reiterated ground support design are acceptable.

18. A computer implemented method of designing a ground support system for an underground excavation, comprising:
defining a plurality of input parameters for the underground excavation, the input parameters comprising an excavation geometry, expected stress states, and geotechnical properties of host rock;
estimating, using a computer, a ground type category from among a plurality of ground type categories, the plurality of ground type categories comprising at least a ground type of Category 1, said estimating based on at least some of the plurality of input parameters;
conducting, using the computer, a first design iteration to develop an initial ground support design, the first design iteration being based on at least some of the plurality of input parameters;
evaluating, using the computer, a kinematic stability of the initial ground support system design; and
using the initial ground support system design as a final ground support system design when the initial ground support system design meets the predetermined factor of safety for kinematic stability and when the estimated ground type is of Category 1.

19. The method of claim 18, further comprising:
conducting a second design iteration if the kinematic stability of the initial ground support design does not meet the predetermined factor of safety for kinematic stability, said second design iteration comprising modifying the initial ground support design until the second design iteration meets the predetermined factor of safety for kinematic stability; and
using the second design iteration as the final ground support system design when the estimated ground type is of Category 1.

20. The method of claim 19 further comprising conducting a third design iteration when the estimated ground type category is not Category 1.

21. The method of claim 20, wherein said third design iteration comprises:
performing a depth of failure evaluation to produce an estimated depth of failure; and modifying the third design iteration until a bond length exceeds the estimated depth of failure.

22. The method of claim 21, wherein the plurality of ground type categories further comprises a ground type of Category 2 and wherein said third design iteration further comprises:
performing a spalling/brittle failure evaluation;
modifying the ground support system design until the modified ground support system design passes the spalling/brittle failure evaluation; and
using the third design iteration as the final design when the third design iteration passes the spalling/brittle failure evaluation and when the estimated ground type category is of Category 2.

23. The method of claim 22, further comprising conducting a fourth design iteration when the third design iteration does not pass the spalling/brittle failure evaluation.

24. The method of claim 23, wherein said fourth design iteration further comprises performing a bursting/dynamic failure evaluation.

25. The method of claim 24, wherein said fourth design iteration further comprises:
performing a dynamic risk assessment; and
using said fourth design iteration as the final design when said fourth design iteration passes the dynamic risk assessment and when said estimated ground type is of Category 2.

26. The method of claim 25 wherein the plurality of ground type categories further comprises a ground type of Category 3 and a ground type of Category 4 and wherein said method further comprises conducting a fifth design iteration when the fourth design iteration passes the dynamic risk assessment and when the estimated ground type category is of Category 3 or of Category 4.

27. The method of claim 26, wherein said fifth design iteration comprises performing a squeezing/bulking evaluation.

28. The method of claim 27, wherein said fifth design iteration further comprises:
determining whether support deformations are acceptable; and
completing the ground support design when the support deformations of the fifth design iteration are acceptable.

29. A non-transitory computer-readable storage medium having computer-executable instructions embodied thereon that, when executed by at least one computer processor cause the processor to:
define a plurality of input parameters for the underground excavation, the input parameters comprising an excavation geometry, expected stress states, and geotechnical properties of host rock;
estimate a ground type category from among a plurality of ground type categories, the plurality of ground type categories comprising at least a ground type of Category 1, said estimate based on at least some of the plurality of input parameters;
conduct a first design iteration to develop an initial ground support design, the first design iteration being based on at least some of the plurality of input parameters;
evaluate a kinematic stability of the initial ground support system design; and
use the initial ground support system design as a final ground support system design when the initial ground support system design meets the predetermined factor of safety for kinematic stability and when the estimated ground type is of Category 1.

* * * * *

UNITED STATES PATENT AND TRADEMARK OFFICE
CERTIFICATE OF CORRECTION

PATENT NO. : 10,445,443 B2
APPLICATION NO. : 15/274052
DATED : October 15, 2019
INVENTOR(S) : Richard Hudson Page 1 of 1

It is certified that error appears in the above-identified patent and that said Letters Patent is hereby corrected as shown below:

In the Specification

Column 15, Line 63: Delete "Ration" and insert --Ratio--

In the Claims

Column 27, Line 46: After "reiterating" insert --, using the computer,--
Column 29, Line 5: Delete "election" and insert --ejection--

Signed and Sealed this
Seventh Day of January, 2020

Andrei Iancu
*Director of the United States Patent and Trademark Office*